United States Patent [19]
Sajoto et al.

[11] Patent Number: 6,066,209
[45] Date of Patent: May 23, 2000

[54] COLD TRAP

[75] Inventors: Talex Sajoto, Campbell; Jun Zhao, Cupertino; Vincent Ku, San Jose; Charles Dornfest, Fremont, all of Calif.

[73] Assignee: Applied Materials, Inc., Santa Clara, Calif.

[21] Appl. No.: 09/052,743

[22] Filed: Mar. 31, 1998

Related U.S. Application Data

[62] Division of application No. 08/927,700, Sep. 11, 1997.

[51] Int. Cl.$^7$ .................................................. C23C 16/00
[52] U.S. Cl. .............................. 118/715; 62/55.5; 55/355; 118/724
[58] Field of Search .................... 118/715, 723, 118/724; 62/55.5; 505/1; 55/DIG. 15, 269; 156/345; 210/500.1, 348

[56] References Cited

U.S. PATENT DOCUMENTS

| | | |
|---|---|---|
| 5,000,113 | 3/1991 | Wang et al. . |
| 5,204,314 | 4/1993 | Kirlin et al. . |
| 5,820,641 | 10/1998 | Gu et al. ..................................... 55/269 |

FOREIGN PATENT DOCUMENTS

| | | |
|---|---|---|
| 0 636 704 A1 | 2/1995 | European Pat. Off. ......... C23C 16/34 |
| 0 738 788 A2 | 10/1996 | European Pat. Off. ......... C23C 16/44 |
| 0 780 490 A1 | 6/1997 | European Pat. Off. ......... C23C 16/44 |

OTHER PUBLICATIONS

PCT Search Report dated Jan. 27, 1999.
U.S. application No. 08/749,613, Fairbairn, filed Nov. 18, 1996.
U.S. application No. 08/927,700, Somekh et al. filed Sep. 11, 1998.
U.S. application No. 09/052,747, Sajoto et al., filed Mar. 31, 1998.
U.S. application No. 09/052,763, Zhao et al., filed Mar. 31, 1989.
U.S. application No. 09/052,765, Zhao et al., filed Mar. 31, 1998.
U.S. application No. 09/052,766, Sajoto et al., filed Mar. 31, 1998.
U.S. application No. 09/052,767, Dornfest et al., filed Mar. 31, 1998.
U.S. application No. 09/052,792, Sajoto et al., filed Mar. 31, 1998.
U.S. application No. 09/052,885, Sajoto et al., filed Mar. 31, 1998.

*Primary Examiner*—Timothy Meeks
*Assistant Examiner*—Norca L. Torres-Velazquez
*Attorney, Agent, or Firm*—Thomason Moser & Patterson

[57] ABSTRACT

The invention relates to an apparatus and process for filtering deposition gases in a substrate processing system. Particularly contemplated is an apparatus and process for the filtering deposition gases of a metal-oxide film deposited on a silicon wafer to make integrated circuits. In one embodiment, the invention provides an apparatus for filtering a fluid in a semiconductor processing system, comprising a housing and a filtering member disposable in the housing, the filtering member comprising a base portion and a filtering portion having an inlet and an outlet and a plurality of temperature controlled fluid passages formed between the inlet and the outlet, the passages having a length longer than a width across the passages.

23 Claims, 25 Drawing Sheets

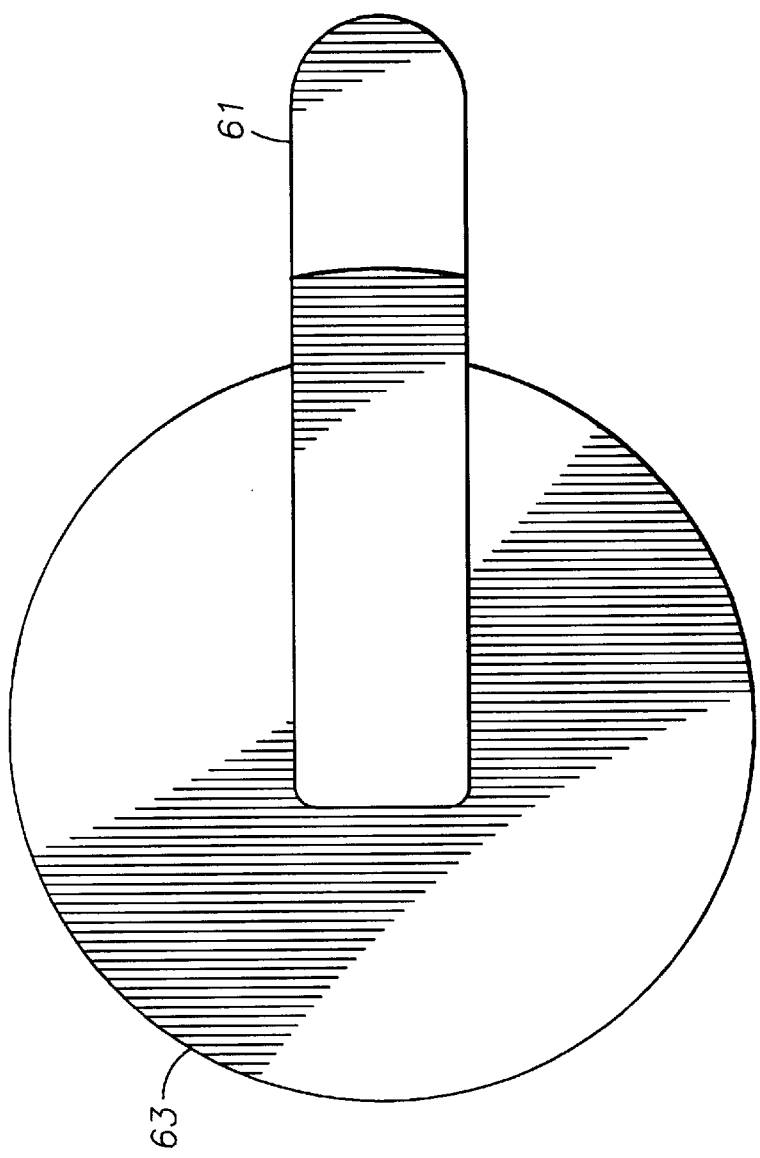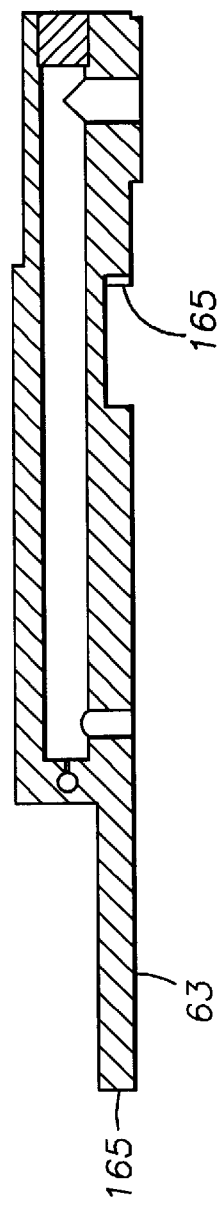
FIG. 9
FIG. 10

Ti REPEATABILITY TEST WITH < +/-0.5C WAFER HEATER DURING DEPOSITION

| SUBSTRATE | Ti FLOW | Ti MOLE % | | | Ba MOLE % | | | Sr MOLE % | | |
|---|---|---|---|---|---|---|---|---|---|---|
| | | WAFER 1 | WAFER 2 | DELTA | WAFER 1 | WAFER 2 | DELTA | WAFER 1 | WAFER 2 | DELTA |
| Si PRIME | 110 | 54.6 | 54.49 | 0.11 | 29.48 | 30.3 | -0.82 | 15.92 | 15.2 | 0.72 |
| Si PRIME | 100 | 52.45 | 52.04 | 0.41 | 31.51 | 33.04 | -1.53 | 16.04 | 14.93 | 1.11 |
| Si PRIME | 90 | 52.1 | 51.7 | 0.4 | 31.12 | 31.77 | -0.65 | 16.77 | 16.53 | 0.24 |
| Pt / OX / 1 Si RECI | 110 | 65.34 | 61.48 | 3.86 | 22.54 | 25.73 | -3.19 | 12.11 | 12.78 | -0.67 |
| Pt / OX / 2 Si RECI | 100 | 60.03 | 60.5 | -0.47 | 26.75 | 26.16 | 0.59 | 13.22 | 13.34 | -0.12 |
| Pt / OX / 1 Si RECI | 90 | 61.8 | 60.9 | 0.9 | 24.44 | 26.2 | -1.76 | 13.75 | 12.87 | 0.88 |

*FIG. 24*

COLD TRAP

This is a divisional application of U.S. patent application Ser. No. 08/927,700 filed Sep. 11, 1997.

BACKGROUND OF THE INVENTION

1. Field of the Invention

The invention relates to an apparatus and process for the vaporization of liquid precursors and deposition of a film on a suitable substrate. Particularly contemplated is an apparatus and process for the deposition of a metal-oxide film, such as a barium strontium titanate (BST) film, on a silicon wafer to make integrated circuit capacitors useful in high capacity dynamic memory modules.

2. Background of the Invention

The increasing density of integrated circuits (ICs) is driving the need for materials with high dielectric constants to be used in electrical devices such as capacitors for forming 256 Mbit and 1 Gbit DRAMs. Capacitors containing high-dielectric-constant materials, such as organometallic compounds, usually have much larger capacitance densities than standard $SiO_2$—$Si_3N_4$—$SiO_2$ stack capacitors making them the materials of choice in IC fabrication.

One organometallic compound of increasing interest as a material for use in ultra large scale integrated (ULSI) DRAMs is BST due to its high capacitance. Deposition techniques used in the past to deposit BST include RF magnetron sputtering, laser ablation, sol-gel processing, and chemical vapor deposition (CVD) of metal organic materials.

A liquid source BST CVD process entails atomizing a compound, vaporizing the atomized compound, depositing the vaporized compound on a heated substrate and annealing the deposited film. This process requires control over the liquid precursors and gases from introduction from an ampoule into a liquid delivery system through vaporization and ultimately to the surface of the substrate where it is deposited. The goal is to achieve a repeatable process which deposits a film of uniform thickness under the effects of a controlled temperature and pressure environment. The goal has not been satisfactorily achieved because the precursors are finicky and the deposition equipment requires a complex design.

For example, one difficulty encountered is that the delivery of liquid precursors has typically required positive displacement pumps. Pumps can become clogged and require replacement if the precursors deposit on the surfaces of the pumping system. In addition, use of positive displacement pumps becomes problematic when the delivery lines or the vaporizer become clogged with deposits because the pump can rupture the pressure seals or continue to operate until the pressure relief valves on the pump are tripped. Either result may require maintenance and repair and over time repair and replacement of pumps becomes very expensive and increases the cost of ownership of the equipment.

Another difficulty encountered is that BST precursors have a narrow range of vaporization between decomposition at higher temperatures and condensation at lower temperatures thereby requiring temperature controlled flow paths from the vaporizer into the chamber and through the exhaust system. In addition, the liquid precursors tend to form deposits in the delivery lines and valves disposed throughout the system.

Another difficulty encountered is the difficulty or lack of efficiency in vaporizing the liquid precursors. Typically, only a portion of the liquid precursors are vaporized due to low conductance in the vaporizer, thereby inhibiting deposition rates and resulting in processes which are not consistently repeatable. In addition, known vaporizers used in CVD processes incorporate narrow passages which eventually become clogged during use and are not adapted for continuous flow processes which can be stabilized. This too results in a reduction in vaporization efficiency of the liquid precursors and negatively affects process repeatability and deposition rate. Still further, known vaporizers lack temperature controlled surfaces and the ability to maintain liquid precursors at a low temperature prior to injection into the vaporizer. This results in deposition of material in the injection lines in the vaporizer and premature condensation or unwanted decomposition of the precursors.

Still another difficulty encountered in the deposition of BST is that the deposition process is performed at elevated substrate temperatures, preferably in the range of about 400–750° C. and the annealing process is performed at substrate temperatures in the range of about 550°–850° C. These high temperature requirements impose demands on the chambers used in the deposition process. For example, elastomeric O-rings are typically used to seal the deposition chamber and are not generally made of materials that will resist temperatures in excess of about 100° C. for many fabrication cycles. Seal failure may result in loss of proper chamber pressure as well as contamination of the process chemistry and the system components, thereby resulting in defective film formation on the wafer. In addition, it is necessary to prevent temperature fluctuations of system components which result from thermal conduction. Loss of heat due to thermal conduction causes temperature gradients across the surface of the substrate resulting in decreased uniformity in film thickness and also increases the power demands required of the system to maintain the high temperature environment in the chamber.

There is a need, therefor, for a deposition apparatus and method which can deliver liquid precursors to a vaporizer, efficiently vaporize the precursors, deliver the vaporized precursors to the surface of a substrate and exhaust the system while maintaining elevated temperatures in the chamber, preventing unwanted condensation or decomposition of precursors along the pathway and avoiding temperature gradients in the system. It would be preferable if the system were adapted for rapid cleaning and continuous flow operation.

SUMMARY OF THE INVENTION

In one aspect of the invention, a deposition chamber is provided for depositing BST and other materials which require vaporization, especially low volatility precursors which are transported as a liquid to a vaporizer to be converted to vapor phase and which must be transported at elevated temperatures to prevent unwanted condensation on chamber components. Preferably, the internal surfaces of the chamber are maintainable at a suitable temperature above ambient, e.g., 200–300° C., to prevent decomposition and/or condensation of vaporized material on the chamber and related gas flow surfaces. The chamber comprises a series of heated temperature controlled internal liners which are configured for rapid removal, cleaning and/or replacement and preferably are made of a material having a thermal coefficient of expansion close to that of the deposition material. The chamber also preferably includes features that protect chamber seals, e.g., elastomeric O-rings, from the deleterious effects of high temperatures generated during fabrication of electrical devices, such as capacitors useful for ULSI DRAMs. This concept is generally referred to as a "hot reactor" within a "cool reactor".

The invention also provides a vaporizing apparatus having large vapor passageways for high conductance to prevent clogging for consistently mixing and efficiently vaporizing liquid precursor components, and delivering the vaporized material to the deposition chamber with negligible decomposition and condensation of the gas in the vaporizer and gas delivery lines. Preferably, the apparatus increases vaporizing efficiency by providing increased surface area and a tortuous pathway with wide passages to reduce the likelihood of fouling or clogging typically associated with existing vaporizers.

The invention also provides a system for delivering liquid source components to the vaporizer without requiring high pressure pumps and which provides gravity assisted feed and cleaning of the lines. Pressurized ampoules deliver the liquid precursors into the vaporizer. The ampules are preferably chargeable up to about 500 psi using an inert gas such as argon. The use of pressurized ampoules eliminates the need for high pressure pumps to deliver the liquid precursors into the vaporizer.

The invention also provides a liquid and gas plumbing system which allows access into the chamber without requiring that any hard plumbing lines be disrupted. Preferably, vaporized materials are delivered from the vaporizer through the chamber body and into a gas distribution assembly in the lid which includes a mixing gas manifold and a gas distribution plate. The chamber body and the mixing gas manifold of the lid sealably connect gas passages disposed therein on engagement.

Still further, the invention provides a flushable system which can operate in a continuous flow mode or a discontinuous mode where it is turned off during the transfer of substrates into or out of the chamber. One or more zero dead volume valves and a gravity feed system enable the system to cycle between a deposition mode where the liquid precursors are vaporized and delivered to the chamber and a substrate transfer mode where solvent is delivered to the lines and valves to flush the system to prevent build-up of material in the liquid/vapor delivery lines. The solvent can be routed through the liquid delivery lines, the vaporizer and through a bypass line and into a disposal system. In addition, the system may continually vaporize precursors but deliver the vaporized material to the exhaust system through a bypass line. This enables stabilization of the process over a number of substrates through optimization and maintenance of the vaporization process.

Still further, the invention provides a pumping system for the chamber which can maintain chamber pressures at a high vacuum state and which has a plumbing system configured to protect the pumps from deposition of deposits therein. In one aspect of the invention, cold traps are disposed upstream from an exhaust pump to remove vaporized gas from the system. In another aspect of the invention, a high vacuum pump is selectively isolated from the exhaust passage by a suitable valve such as a gate valve to enable selective communication with the high vacuum pump in the absence of process gases.

The chemical vapor deposition system of the present invention is characterized by its use in the manufacture of capacitor films of consistently high quality, with significantly reduced maintenance times and easier maintenance and capability for depositing CVD films at high rates with less particle generation. The net result is a fabrication process with enhanced efficiency and economy.

BRIEF DESCRIPTION OF THE FIGURES

FIG. 9 is a top view of a gas manifold;

FIG. 10 is a cross sectional view of a gas manifold;

FIGS. 21–27 are graphical representations of characteristics of a preferred CVD BST 200 mm process.

DETAILED DESCRIPTION OF THE INVENTION

The present invention is directed to a liquid delivery chemical vapor deposition (CVD) system useful in depositing thin metal-oxide films as well as other films requiring vaporization of precursor liquids. The system has particular application for the fabrication of metal-oxide dielectrics useful in making capacitors used in ULSI DRAMs as well as a number of other electrical devices. In general, devices that can be made with the present system are those characterized by having one or more layers of insulating, dielectric or electrode material deposited on a substrate.

Figure 1:
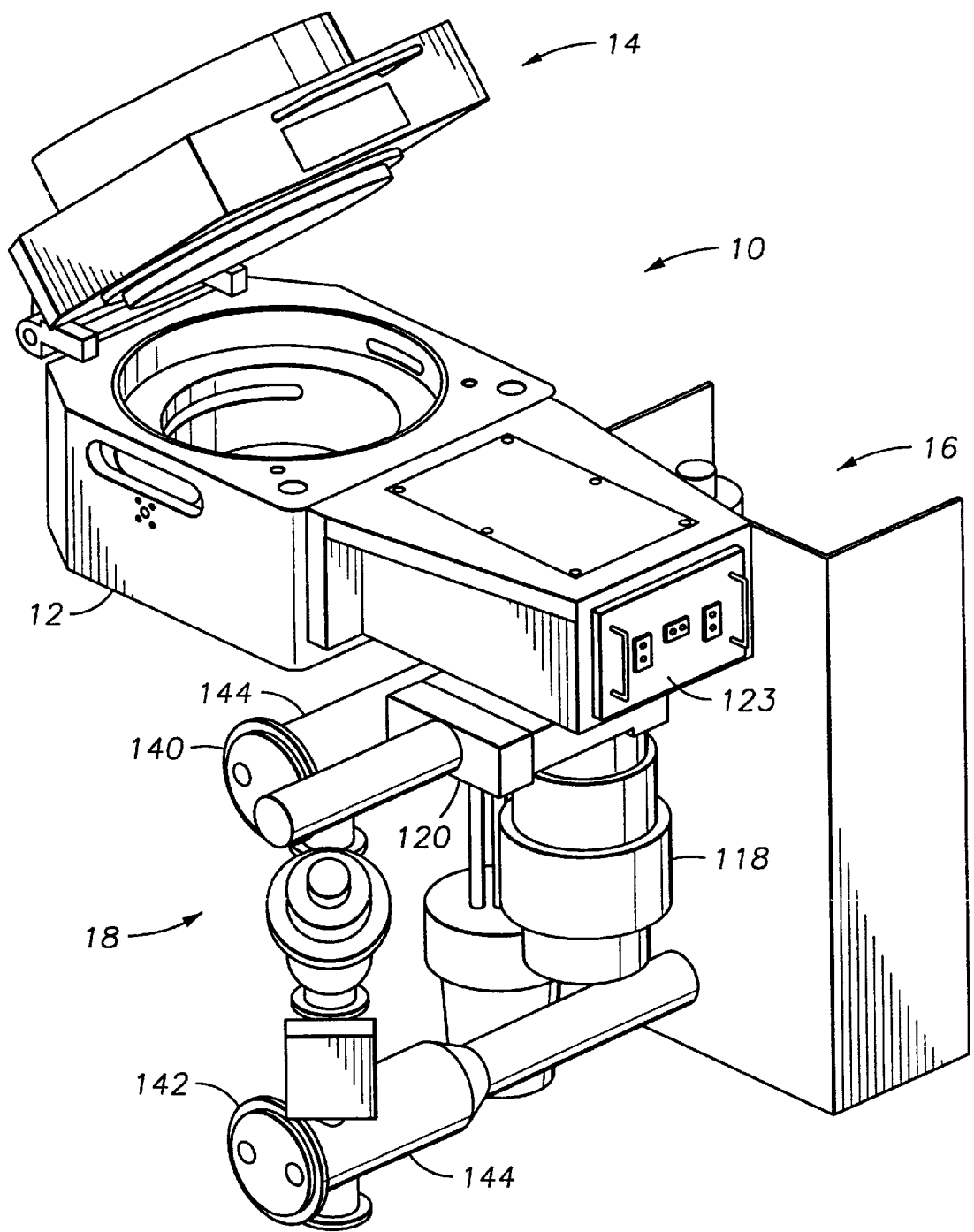
FIG. 1 is a perspective view of a chamber system of the present invention.

FIG. 1 is a perspective view of a CVD system 10 of the present invention. The system 10 generally includes a chamber body 12, a heated lid assembly 14, an integrated vaporizer module 16 and an exhaust/pumping system 18. Not shown in this figure, but a feature of the invention, is a liquid delivery system for supplying the liquid precursors to the vaporizer module. The size and dimensions of the system are dictated by the size and shape of the workpiece on which processes of the present invention are performed. A preferred embodiment of the invention will be described herein with reference to a chamber adapted to process a circular substrate, such as a 200 mm silicon wafer.

The inventors have recognized that deposition layer uniformity can be enhanced, and system maintenance can be reduced, if substantially all of the system components (other than the substrate and substrate heater) which "see" the process chemistry are substantially maintained at an ideal isothermal system temperature (e.g., 250° C.±5° for BST). The deposition chamber incorporates several active and passive thermal control systems, including features for minimizing temperature gradients that can be created as a result of the relatively high temperature of the substrate and the substrate support member. The deposition chamber also includes thermal control features which serve to protect a main chamber seal by cooling it below the ideal isothermal system temperature. Other similar thermal control features maintain a cover enclosing the chamber lid at a relatively safe temperature to prevent burn injuries. Cooling is achieved without inducing significant temperature fluctuations and gradients in the system components exposed to the system chemistry, and without excessive cooling and heating power losses.

The Deposition Chamber

Figure 2:
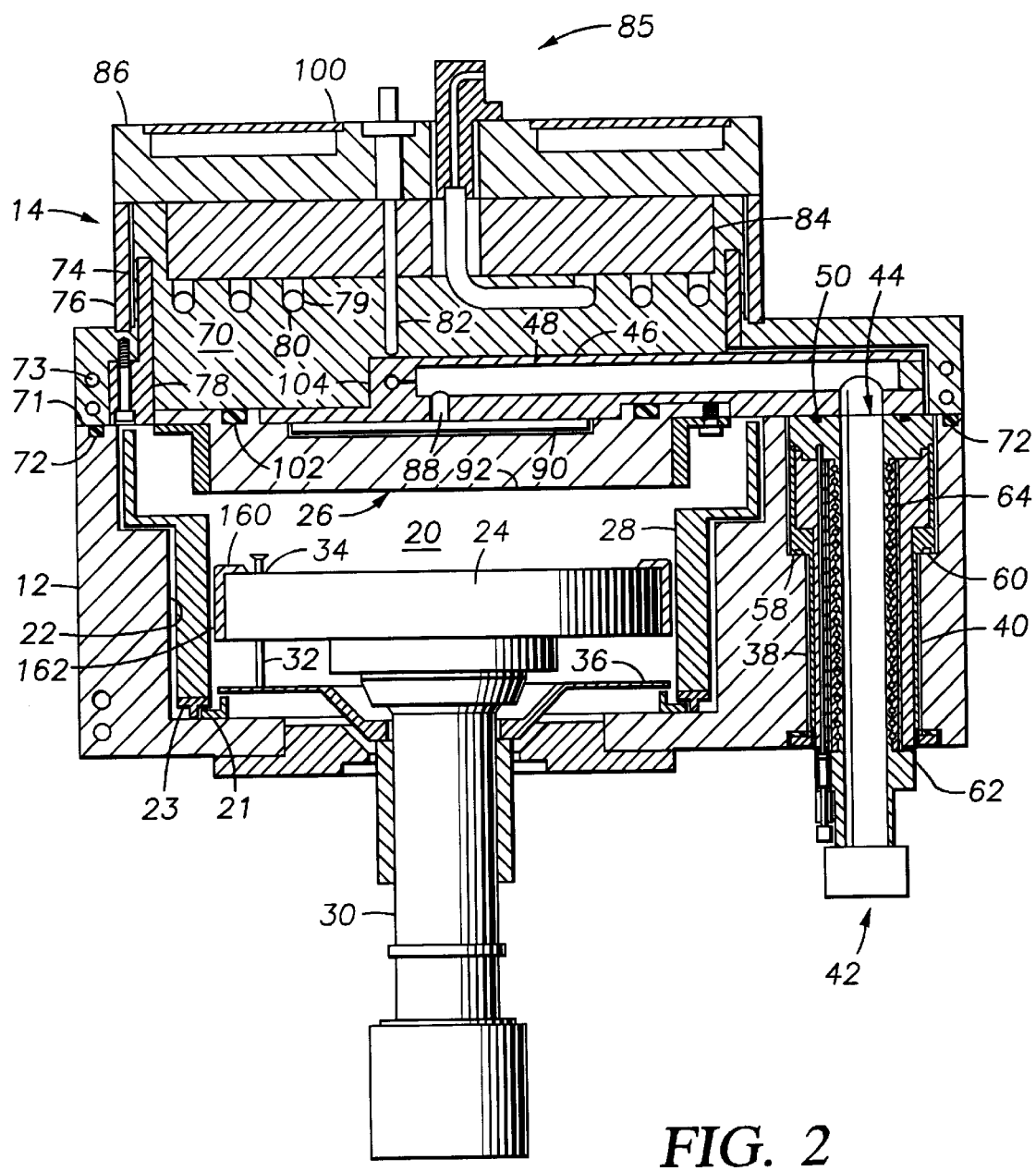
FIG. 2 is cross sectional view of a chamber of the present invention.

FIG. 2 is a cross sectional view of one embodiment of a deposition chamber showing the chamber body 12 supporting a heated lid assembly 14. The chamber body 12 defines an inner annular processing region 20 defined on the perimeter by an inner wall 22. A substrate support member 24 extends through the bottom of the chamber and defines the lower end of the processing region 20. A gas distribution plate 26 mounted on the lid forms the upper limit of the processing region 20. The chamber body 12 and the lid assembly 14 are preferably made of a rigid material such as aluminum, stainless steel or combinations thereof. The chamber body 12 also defines a pumping port for purging the remains of the deposition vapor once it has been delivered over the substrate. A generally U-shaped passage surrounding the gas distribution assembly forms a pumping channel through which gases are drawn into the exhaust system.

The substrate support member 24 may comprise a metal, e.g., aluminum, with a resistive heating element attached thereto or embedded therein. Alternatively, the support member may comprise a ceramic block and embedded ground plate which generates heat when subjected to RF energy emitted by an adjacent electrode. A suitable substrate support member and related lift assembly is shown and described in co-pending U.S. Patent Application entitled Improved "Self Aligning Lift Mechanism," filed on Jul. 14, 1997, and is incorporated herein by reference. This substrate support member is available from Applied Materials, Inc. of Santa Clara, Calif. under the model name CxZ Heater.

The substrate support member generally is movable up and down on a central elevator shaft 30 to move a substrate between a deposition position adjacent the gas distribution plate 26 and a substrate insertion/removal position below a slit valve formed through the chamber body. The entry point of the shaft into the chamber is sealed with a collapsible bellows (not shown). The substrate is lifted from or placed on a robot blade by a set of lifting pins 32 slidably retained in a set of four passageways 34 extending through the substrate support member 24. Directly below each of the pins is a lifting plate 36 which moves the pins vertically within the chamber to allow a substrate to be lifted off or placed on a robot blade which is moved into the chamber through the slit valve opening (not shown).

The chamber body 12 defines one or more passages 38 for receiving a heated gas delivery feedthrough 40 having an inlet 42 and an outlet 44 to deliver one or more precursor gases into the gas distribution plate 26 mounted on the lid assembly 14. The passage 38 defines an upper and a lower end of differing diameters to form a shoulder 58 where the upper and lower ends meet. The gas outlet 44 is fluidically connected to a mixing gas manifold 46 which includes at least a first gas passage 48 to deliver a gas(es) into the gas distribution plate 26. An O-ring seal 50, preferably made of TEFLON® with a stainless steel c-spring, is located around the outlet 44 on the upper chamber wall to provide a sealing connection between the gas delivery feedthrough 40 and the gas manifold 46. One or more oxidizer gas passages 52, similar to passage 38, are also formed in the chamber body 12 adjacent the passage 38 for receiving an oxidizer gas delivery feedthrough which can be heated if desired to deliver one or more oxidizer gases through the chamber wall to the mixing gas manifold 46. A gas passage 54 is formed in the mixing gas manifold 46 to deliver the oxidizer gas to a gas outlet 56, which provides a mixing point located in the gas manifold adjacent the entry port into the gas distribution plate 26. A restrictive gas passage 37 connects the end of the oxidizer gas passage 54 to the end of the vaporized gas passage 48 to provide high velocity delivery as well as mixing of the gas mixture upstream from the gas distribution plate 26.

Figure 3A:
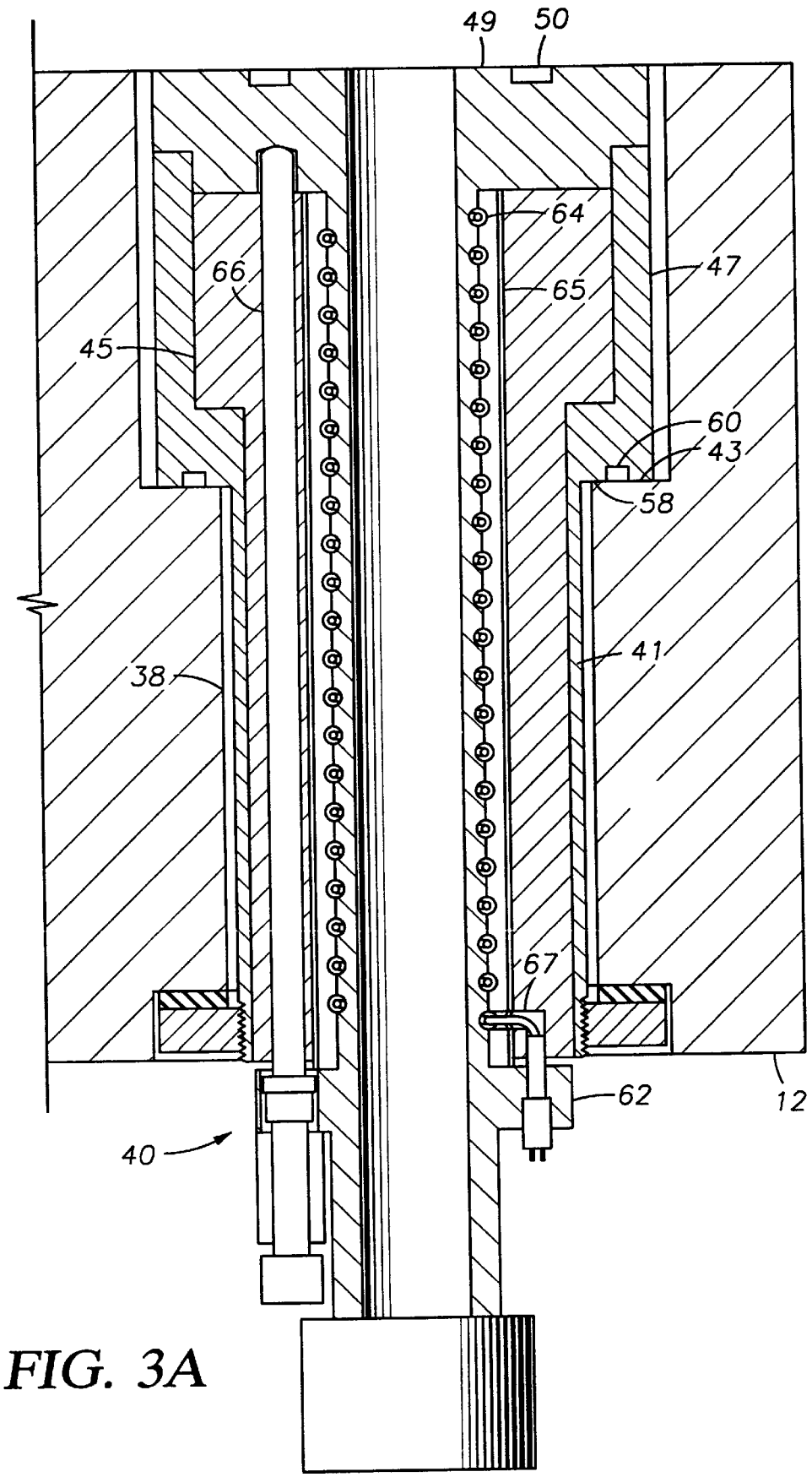
FIG. 3a is a cross sectional view of a heated gas delivery line through the chamber wall.

FIG. 3a is a cross sectional view showing a heated gas delivery feedthrough 40 disposed in the annular passage 38 formed through the chamber wall. The passage includes a shoulder 58 disposed on the upper end of the passage and includes an O-ring seal 50. The feedthrough preferably includes an outer conduit 41 and an inner conduit 45 disposed within the outer conduit. The outer conduit includes a mounting shoulder 43 which is mounted on shoulder 58 of the passage. The outer conduit also includes a lower end having threads thereon for receiving a lock nut to secure the feedthrough in a sealing position within the passage 38 against the shoulder 58 and O-ring seal 50. The inner conduit 45 defines an upper mounting surface 49 for forming a seal with the lid assembly at O-ring seal 50 and also includes a flange 62 on its lower end for mating with the bottom of the chamber body. A cable type heater 64, or other suitable heater, is disposed in intimate contact with the inner conduit of the feedthrough to heat the feedthrough to a desired temperature. A radiation shield 65 is disposed over the heater to prevent thermal radiation from heating the outer conduit 41. A power lead 67 extends from the lower end of the feedthrough and is connected to a suitable power source to heat the feedthrough. A thermocouple 66 is inserted or otherwise disposed in the heated gas delivery feedthrough 40 to monitor the temperature thereof. The feedthrough is mounted in the passage and secured therein using a screw type connector or other suitable connector.

The upper wall 47 of the outer conduit 41 is thinned and sized to define a gap between its outer surface and the inner wall of the chamber body to provide a heat choke adjacent the O-ring seal 50. O-ring 50 is preferably a hot O-ring seal which can withstand temperatures of about 250° C. The thin wall minimizes heat conduction down to the shoulder 58 to protect O-ring seal 60. By minimizing heat conduction, less power is required to heat the feedthrough. Additionally, less thermal mass provides better thermal control and faster response for the feedback control. Still further, the heat choke on the outer conduit prevents heat loss from the mixing gas manifold 46 which is directly connected to the insert and which is heated by the lid body. This avoids generation of cold spots along the path of the vaporized gas.

Figure 3B:
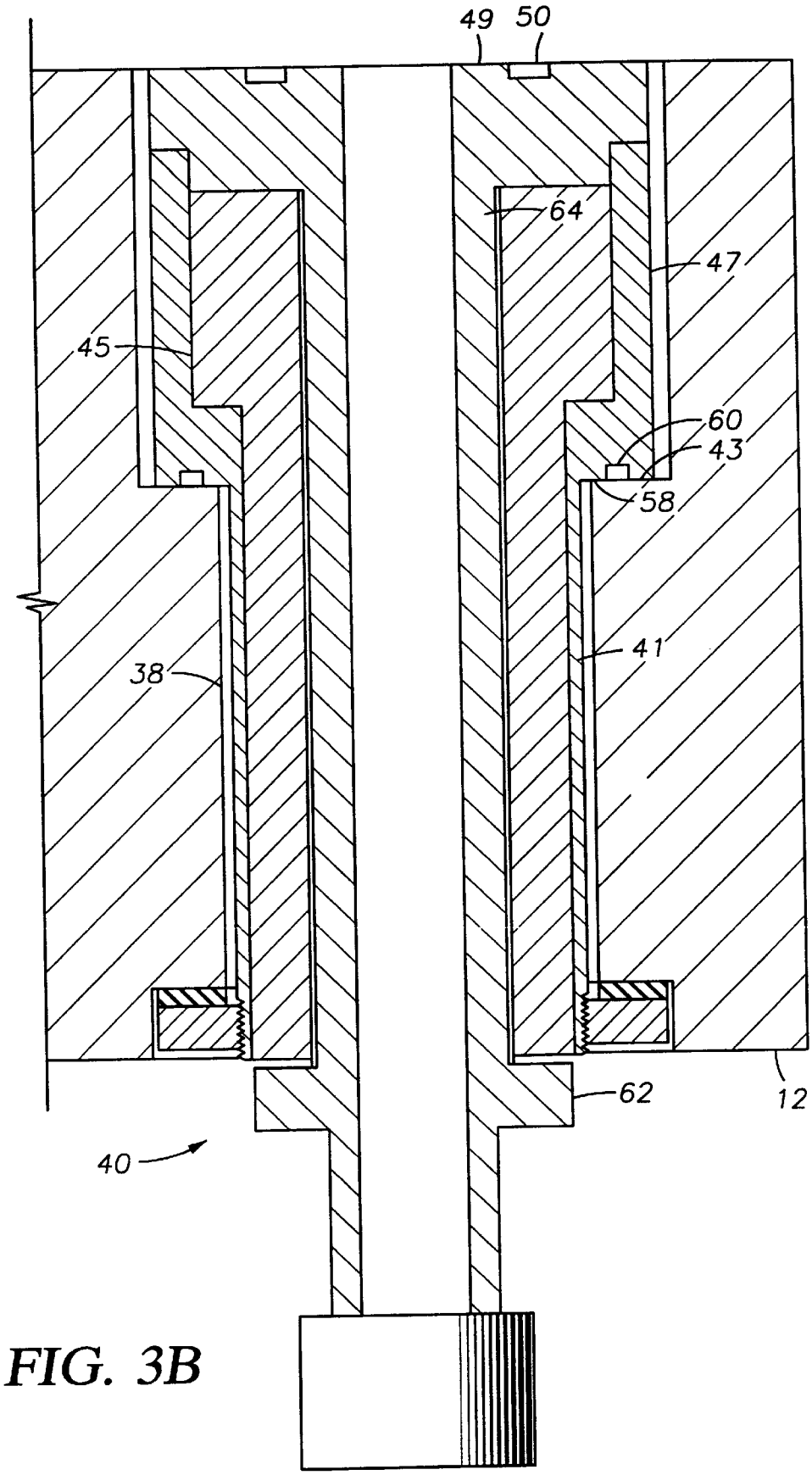
FIG. 3b is a cross sectional view of a gas delivery line through the chamber wall.

FIG. 3b illustrates an embodiment of a gas feedthrough which is not heated. The oxidizer gas(es) are flown through this non-heated feedthrough. However, in applications where a heated oxidizer gas feedthrough is required, one similar to that shown in FIG. 3a can be used. The feedthrough of FIG. 3b resembles that of FIG. 3a except that the cable heater and thermocouple are removed. In addition, the sizes of the feedthrough may vary depending on the requirements of the process. In one embodiment, the non-heated oxidizer gas feedthrough has a smaller gas passage and the overall dimensions are therefor somewhat smaller.

Figure 4:
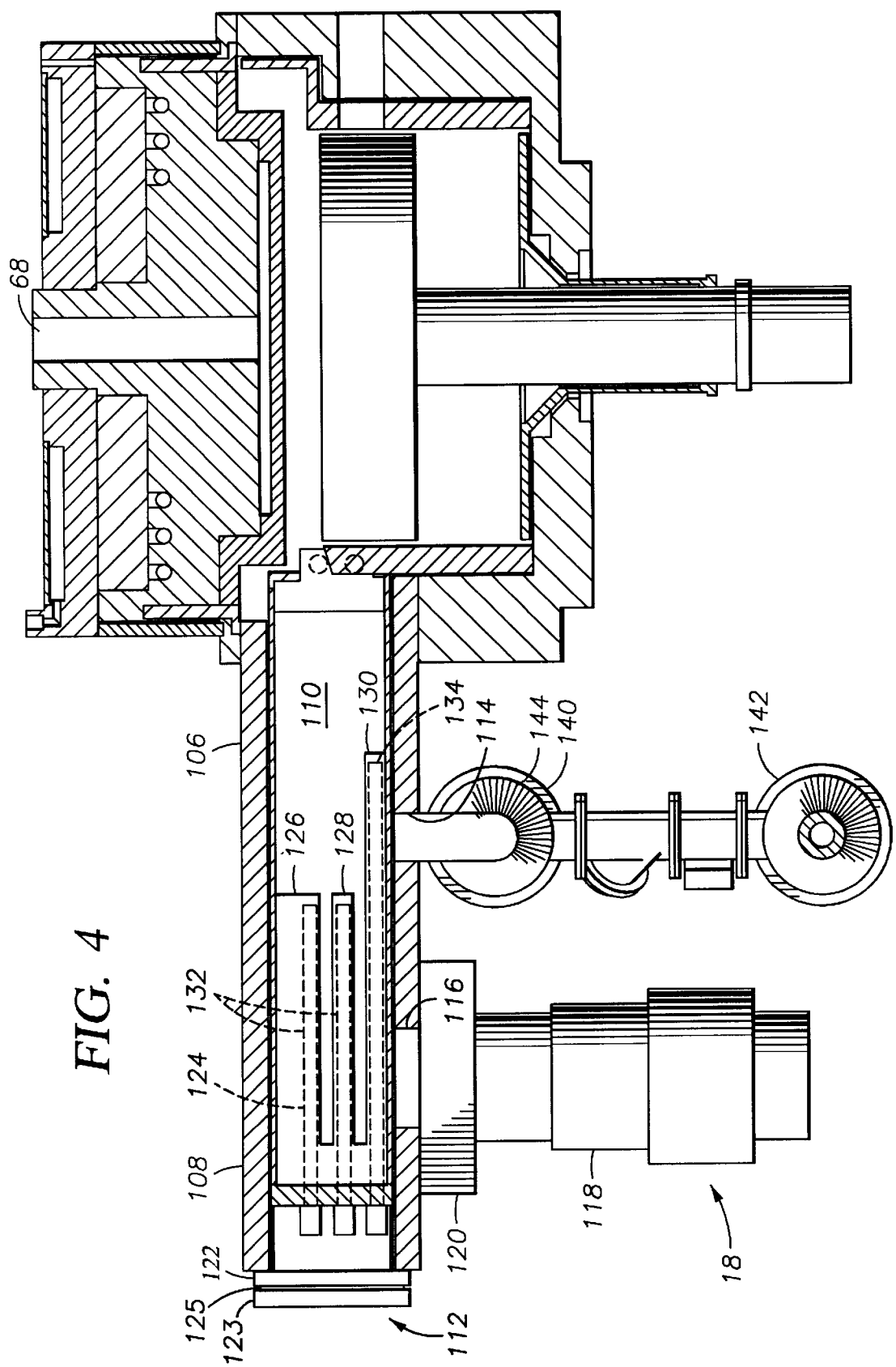
FIG. 4 cross sectional view of an alternative embodiment of a chamber and associated purge gas pumping nose assembly of the present invention.

FIG. 4 is a cross sectional view of an alternative embodiment of the present system. A deposition vapor inlet passageway 68 which communicates directly with a vaporizer outlet port may extend axially through the lid assembly 14. An annular recess surrounding the inlet passageway is formed on a top side of the main lid body.

Referring again to FIG. 2, removable deposition chamber liners (which can be used at a number of different locations) facilitate periodic cleaning of the deposition chamber. A liner in accordance with a preferred embodiment of the invention includes an integral or functionally integral (i.e., assembled from one or more components as attached or overlapping units) generally chamber liner 28 that covers upper chamber surfaces adjacent the substrate support member 24 and a bottom liner 21 covers the lower chamber wall surfaces below substrate support member. The liner material may be made of a metal, e.g., stainless steel or aluminum, a ceramic material (e.g., $Al_2O_3$) or quartz, and can be equipped with an active PID controlled heating element which maintains the liner walls substantially at the optimum isothermal system temperature to inhibit both condensation and decomposition of gas vapor on the chamber surfaces. The material from which the liner is made preferably demonstrates chemical resistance to halogens and halogenated in situ cleaning compounds, and is preferably not adversely affected by, nor adversely affects, the process chemistry.

Figure 5:
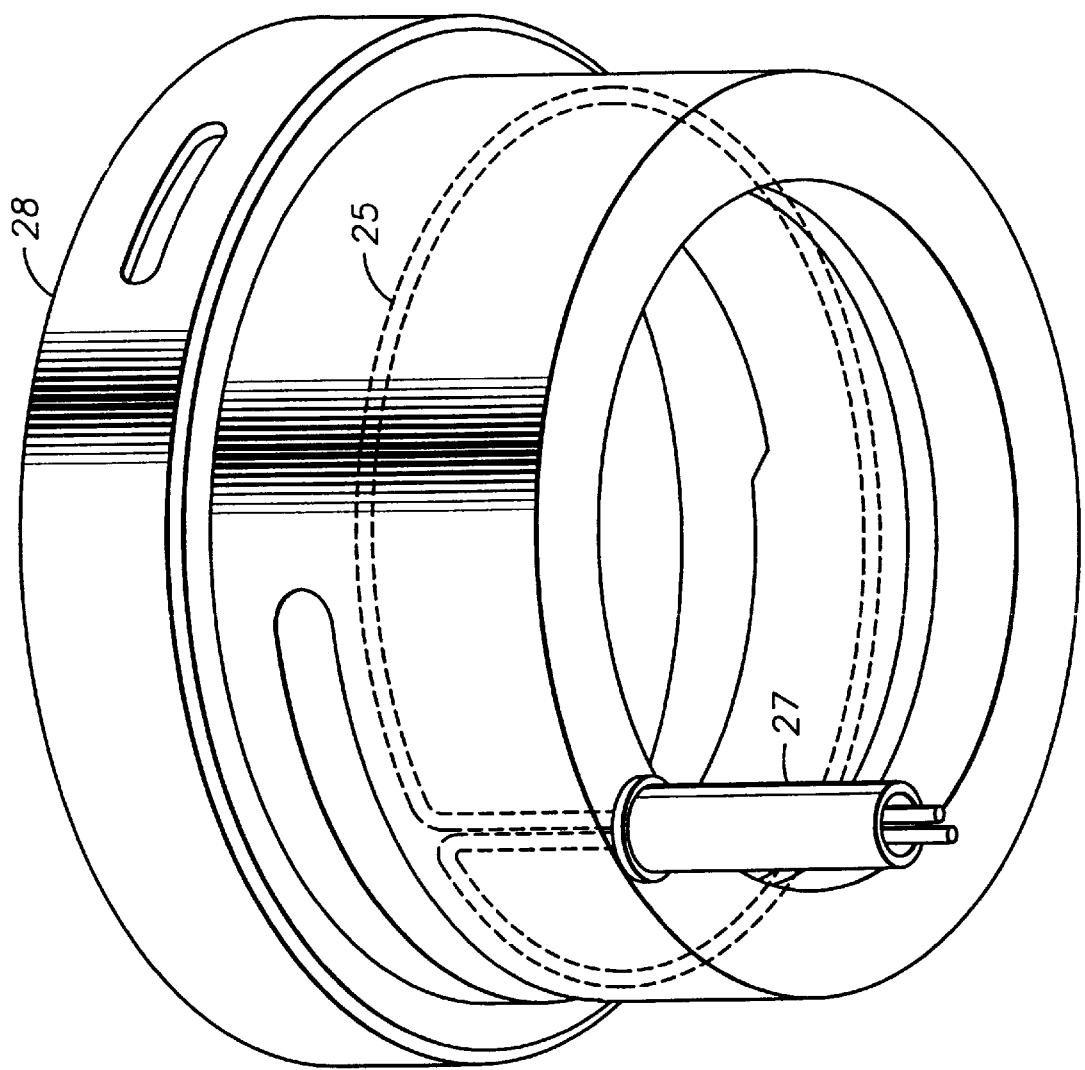
FIG. 5 is a substantially bottom perspective view of a chamber liner.

Referring again to FIG. 2, a chamber liner 28 is preferably disposed adjacent the inner wall 22 of the chamber to provide a removable surface within the chamber which can be easily cleaned and/or replaced. The liner 28 is supported in the chamber on supports 23, preferably three, which are equally spaced around the lower surface of the liner. The supports 23 are sized to minimize the contact area between the chamber liner 28 and the chamber body and thereby minimize heat conduction between the liner and the chamber body. In one embodiment, the liner is heated by radiation from the heated lid and the heated substrate support member. This embodiment is referred to as a passive floating liner. Alternatively, the liner may also include a resistive heater 25 (shown in FIG. 5), or other suitable heater, disposed therein so that it can be actively heated and maintained at an ideal isothermal temperature. This actively heated embodiment is referred to as an active floating liner. FIG. 5 is a substantially bottom perspective view of a heated liner 28 having a resistive heater 25 disposed therein and an electrical connector 27 mounted on the lower surface of the liner which houses the electrical connections to the coil.

Figure 6:
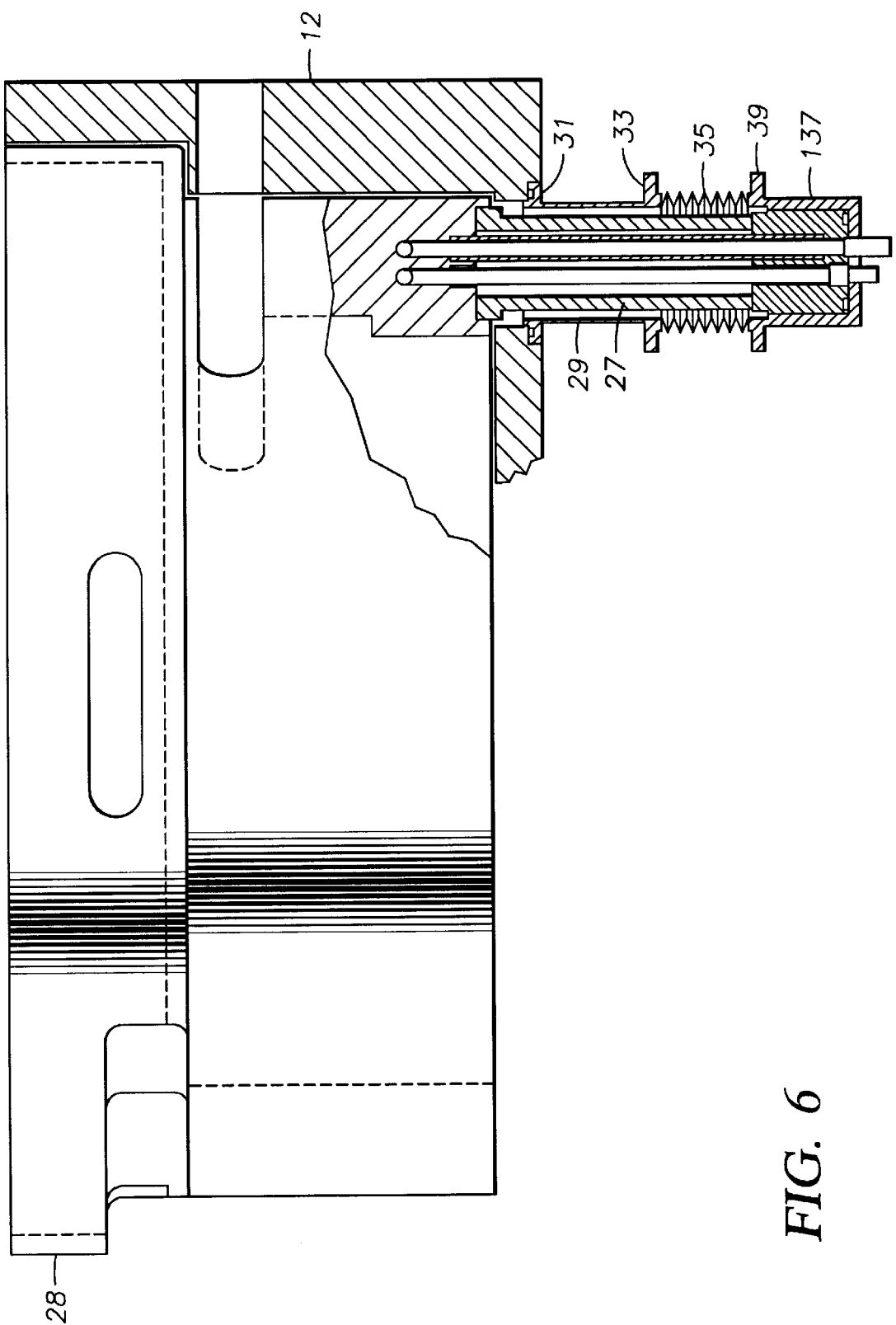
FIG. 6 is a cross sectional view of a chamber liner showing a connector for a resistive heating element.

FIG. 6 is a cross sectional view through the active floating liner 28 showing an external housing mounted on the bottom of the chamber through which the electrical connector 27 is disposed. Due to thermal expansion of the liner, accommodation of the expansion is preferably provided or resisted by the external housing mounted on the chamber. The external housing includes a first conduit 29 having a flange 31, 33 disposed on each end thereof for mounting to the bottom of the chamber and for mounting a bellows 35, respectively. The bellows is mounted on one end to the lower end of flange 33 and at the other end to a second conduit 137 at a flange 39 provided therefor. The bellows is sized and adapted to flex to accommodate any thermal expansion in the electrical connector 27 or the liner 28. The electrical connections to the coil extend through the end of the second conduit 137 for easy connection to a power source.

Since the portions of the liner below the substrate support member are typically isolated from the vapor flow, temperature control of these parts is less critical. However, the portion of the liner below the substrate support member may also be actively heated using a resistive type heating element, or other suitable heating member. Preferably, the temperature of the liner both above and below the substrate support member should be maintainable within the optimum isothermal system temperature range, e.g., between about 200° C. and 750° C., or other temperature range suitable for the desired deposition material.

A sealing edge ring 160 (shown in FIG. 2) is disposed in the chamber and supported on the substrate support member 24 to contact and overlap a circumferential edge of the substrate support member 24. A circumferential rib can be provided on the underside of the ring in order to maintain the ring in an aligned position. The edge ring serves to close-off the annular space 162 between the liner 28 and the substrate support member 24, and thereby substantially reduce the amount of deposition vapor which flows into the lower part of the deposition chamber. In addition, the edge ring acts as a radiation shield. The outer circumferential portion of the gas distribution plate 26 typically extends beyond the diameter of the substrate. The edge ring 160 protects this part of the gas distribution plate 26 from heat directly radiated by the substrate support member. The edge ring 160 is preferably made of a material having a thermal coefficient of expansion similar to that of the deposition material to reduce the possibility of particle generation due to flaking during thermal cycling. In the case of BST, one such edge ring material is titanium.

The lid assembly 14 preferably comprises a main body 70 machined or otherwise formed of a metal having a high thermal conductivity, e.g., aluminum. The main lid body defines an annular channel 74 formed around its perimeter to define a thin outer wall 76. A support ring 78, preferably made of stainless steel or other thermal insulator, is disposed in the channel to provide structural support for the lid and to prevent thermal conduction to the outer wall 76. The thin outer wall of the body member provides a thermal choke for the base 71 of the lid which is sealed to the chamber body during processing at the O-ring seal 72. The O-ring seal 72 is positioned at a circumferential interface of the chamber body 12 and the lid assembly to maintain a hermetic and vacuum tight seal of the chamber. In order to actively cool the O-ring seal, one or more cooling channels 73 are preferably disposed in the lower lip of the outer wall 76. A heat exchange fluid (e.g., water, ethylene glycol, silicone oil, etc.) circulates through the channel to remove heat at the O-ring seal.

The thermal choke provided by the thin outer wall 76 isolates the O-ring seal 72 between chamber lid assembly 14 and the chamber body 12 from the heat generated by heating elements 80 disposed in the lid. The heat choke provides thermal protection of the O-ring seal 72 by allowing localized active cooling within the channel on top of the O-ring 72, without inducing significant detrimental cooling effects on the other system components. The thin wall 76 presents an effective thermal barrier between the heating elements and the O-ring due to its small cross-sectional area (A) and long length (l).

The upper surface of the main lid body 70 defines a plurality of annular recesses 79, such as spiral grooves, for receipt of a heating element 80 therein. In a preferred embodiment, a heater with a power output of about 6200 W is used. However, the amount of power will vary depending on the lid design and geometry, including material composition of the lid, and the process temperature. Power is delivered to the heating elements through a feedthrough 85 disposed in the lid. The heater is preferably controlled with conventional PID feedback control, based on signals received from a thermocouple 82 positioned or otherwise disposed in the lid. An annular plate 84 serving as a heat shield is mounted on the top of the heating elements. Preferably, the plate 84 is brazed to the lid body to form an integral part of the lid body. A water cooled cover plate 86 is disposed on or over the plate 84 to provide a controlled mechanism for pulling heat out of the lid for active feedback temperature control.

A cooling channel 100 is preferably formed in top cover plate 86 of the lid assembly 14. Cooling channel 100 removes heat from the lid. In addition, a thermal choke gap, preferably about 25 mils, is used to control the amount of heat removed from the lid during cooling. During deposition of a material such as BST, the substrate will be heated by the substrate support member to a temperature of over 500° C. Heat from the substrate and the substrate support member will radiate onto the gas distribution plate 26 thereby tending to increase its temperature above the optimum isothermal system temperature. By increasing the thermal conduction or transfer between the lid and the gas distribution plate 26, the substrate and substrate support member induced temperature gradients and fluctuations can be reduced. In order to improve heat conductivity between the lid and the gas distribution plate 26, an inert gas (e.g. helium, hydrogen, etc.) is circulated about the annular interface of these elements. The inert gas is introduced into channel 102, which may be circular, spiral or other shape, disposed in the lid. The channel can be formed in the mating annular surface(s) of the gas distribution plate 26 and the main lid body 70 and/or in the cover plate 86. The inert gas can be introduced from the top through the cooling plate or through the bottom of the chamber via a feedthrough connected to the gas manifold. Gas pressure in the channels can be maintained within the range from about 1–100 Torr, preferably within the range of about 1–20 Torr. Due to its high thermal conductivity, the circulating inert gas can improve heat transfer between the lid assembly 14 and the gas distribution plate 26.

The lid assembly, including the heating element, is configured to maintain the vapor inlet passageway and gas distribution plate at an ideal isothermal system temperature, e.g., 250° C.±5°. Passive and active cooling elements are used to maintain the top cover of the lid, and the O-ring seal 72 positioned between the chamber body and the lid assembly, at a substantially lower temperature, e.g., 100° C. or lower.

Referring again to FIG. 2, the mixing gas manifold 46 includes a central opening 88 which delivers the gases to a blocker plate 90 to initially disperse or distribute the gas(es) over a large area above a face plate 92. Each of the blocker plate and the face plate have a plurality of holes formed therethrough which evenly disperse the gas over the area of the plates 90, 92 and together form the gas distribution plate 26. The face plate 92 delivers the gas uniformly over the area of a substrate positioned on the substrate support member 24. The gas distribution plate 26 and the mixing gas manifold 46 are preferably made of aluminum and are sufficiently thick to allow heat transfer from the gas distribution plate to the temperature controlled lid assembly 14.

With respect to the gas distribution plate assembly, the use of a conventional thin blocker plate 90 with a relatively thicker face plate 92 also serves as a thermal control system. The mixing gas manifold 46 serves as a heated mass whose heat capacity and high thermal conductivity act as a source of thermal inertia resisting temperature variations from the center of gas distribution plate to its periphery. The gas mixing manifold 46 also avoids the effects of gas "channeling" through the material of the plate for providing a more even distribution of gas volume across the substrate surface. While the gas distribution plate is preferably made of aluminum, another thermally conductive material may also be used.

Figure 7:
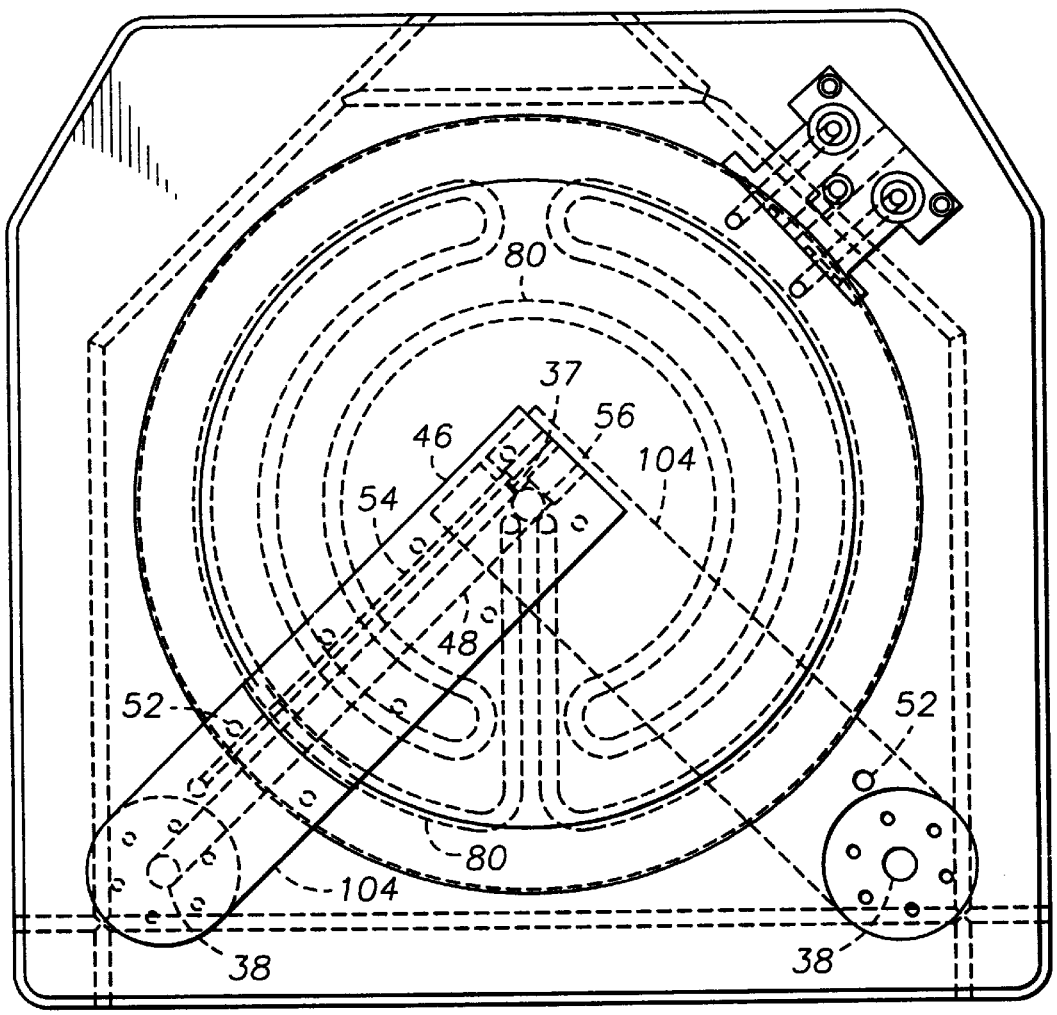
FIG. 7 is a top view of a lid of the present invention.
Figure 8:
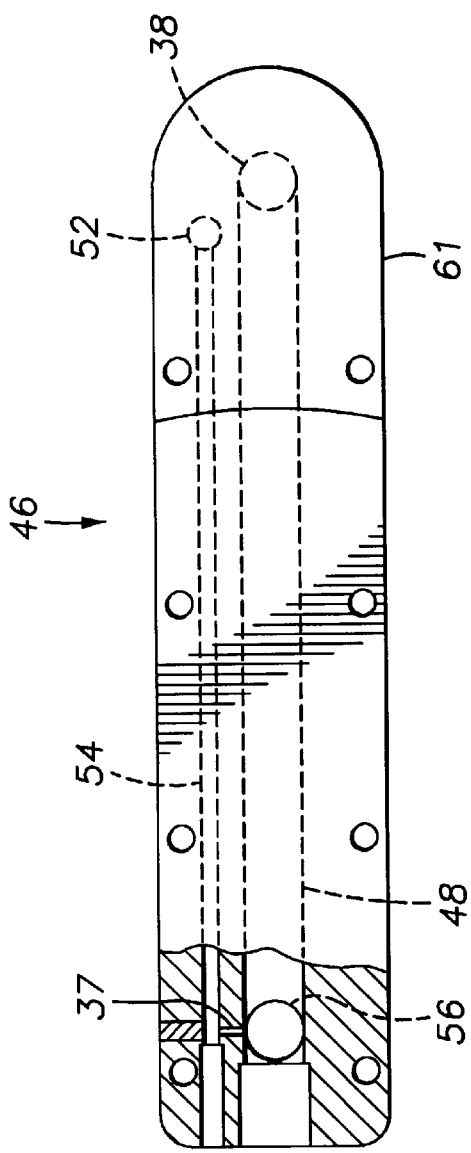
FIG. 8 is a partial cross sectional view of a gas manifold.

FIG. 7 is a top view of a chamber lid showing the heating element 80 and the mixing gas manifold 46. The lower surface of the lid body defines one or more channels 104 for mounting a gas manifold 46. FIG. 8 is a partial cross sectional view of a gas manifold 46. The gas manifold 46 includes a gas delivery block 61 which defines one or more gas passages 48, 54 therein having one or more gas inlets 38, 52 on one end and a gas outlet 56 on the other end. The gas outlet 56 serves as a gas inlet of the gas distribution plate 26. FIG. 9 is a top view of a gas manifold. An annular conductance restrictor plate 63 is mounted on the lower surface of the gas delivery block to mount the gas distribution plate and prevent gas leakage at the interface between the gas manifold and the gas distribution plate. FIG. 10 is a cross sectional view of the gas manifold. The conductance restrictor plate 63 is sized and adapted to define an annular mounting recess 165 to which the gas distribution plate is secured.

A vaporized gas passage 48 and an oxidizer first gas passage 54 extend at least partially along the length of the gas manifold from the gas inlets to the gas outlet. The restricting gas passage 37 is disposed between the vapor gas passage and the oxidizer gas passage to optimally mix and deliver the oxidizer gas into the gas outlet and then to the blocker plate and face plate. The restrictive gas passage 37 delivers the oxidizer gas into the vaporized gas passage at a relatively high velocity to assist in mixing of the gases. Alternatively or additionally, a second set of a vaporized gas passage and an oxidizer gas passage, a carrier gas passage or a cleaning gas passage (to deliver a cleaning gas species from a remote plasma source) may also be provided through the chamber wall to deliver these gases to a second gas manifold.

FIG. 4 shows a partial cross sectional view of a pumping system 18 of the present invention. The pumping system 18 includes a pumping nose 106 mounted on the chamber which connects an exhaust passage and related pumps to the chamber. The pumping nose 106 includes a housing 108 which defines a gas passage 110 along its length. The housing supports a removable heated liner 112. Both the housing and the liner define a pair of ports 114, 116, one port 114 connected to a cold trap and exhaust pump and the other port 116 connected to a turbopump 118, or other high vacuum pump, with a gate valve 120 disposed therebetween.

Figure 12:
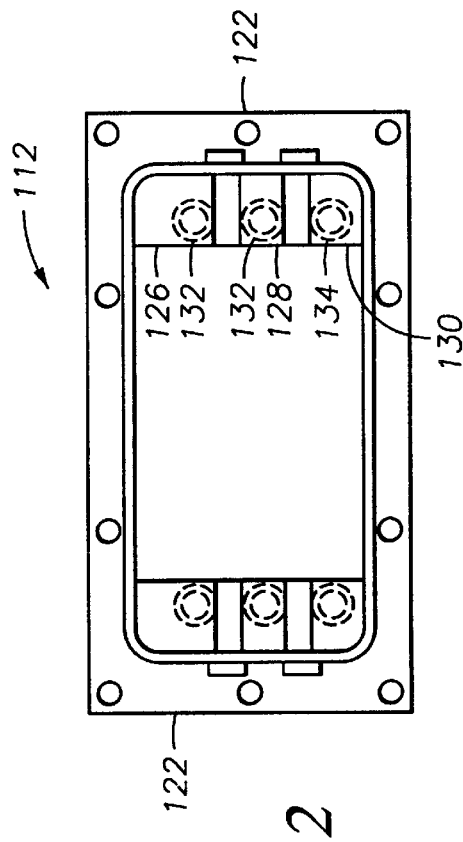
FIG. 12 is an end view of a mounting flange for the nose liner.

The removable heated liner 112 is shaped and sized to slidably mount within the nose housing 108 and includes a mounting flange 122 on one end to mount to the end of the housing. A second mounting plate 123 is mounted on the first and sealed thereto using an O-ring seal 125. The exhaust liner includes a body 124 which defines a central gas passage 110 opening into the exhaust manifold in the chamber and the two exit ports, preferably connecting a high vacuum pump and an exhaust pump and related cold traps. Six mounting blocks 126, 128, 130 (three of which are shown) extend at least partially along the length of the central passage to mount four cartridge heaters 132 and two thermocouples 134. The multiple thermocouples provide a back up as well as enable checking temperature uniformity. In one embodiment, the thermocouples extend along the bottom of the liner while the heaters are disposed along the top and in the central portion of the liner. However, other configurations such as heaters on the top and bottom and thermocouples in the middle or heaters on the bottom and middle and thermocouples on the top are contemplated by the present invention. The heaters are preferably connected in parallel and two connections are provided on the mounting flange of the liner for easy connection to a power source. A cap may be mounted over the mounting plates when removed from the system so that the exhaust liner can be easily cleaned without the risk of jeopardizing the electrical connections to the heaters. The cap can be sealed to the second mounting plate 123 using an O-ring seal or other suitable seal. Also, a handle is preferably mounted on the second mounting plate to facilitate easy removal of the exhaust liner from the nose and submersion in a cleaning bath. Preferably, the second mounting plate 123 includes quick connects for the heaters and the thermocouple cables. FIG. 12 is a front view of the second mounting flange 122 showing the heater and thermocouple connections and positions.

Figure 11:
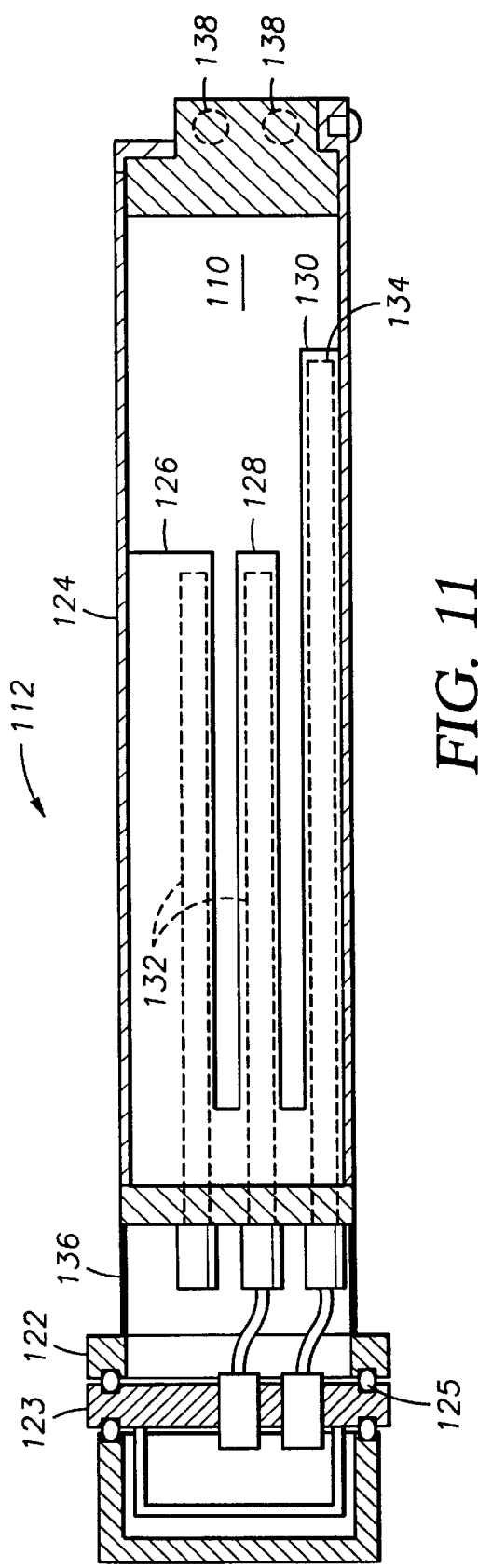
FIG. 11 is a side view of a heated nose liner.

FIG. 11 is a cross sectional view of an removable heated liner 112. The end of the liner adjacent mounting flange 122 includes a thin walled portion 136 around its circumference which acts as a thermal choke. The thermal choke ensures that an O-ring disposed between the mounting flange 122 and the exhaust housing is not subjected to elevated temperatures. Additionally, the thermal choke regulates the amount of heat transferred to the housing thereby minimizing (i.e., optimizing) the amount of power required to heat the liner. The end proximate the chamber is curved to match the curvilinear contour of the inner wall of the exhaust manifold. TEFLON® screws 138 are inserted at the chamber of the exhaust liner on at least the bottom and/or the sidewalls of the exhaust liner, preferably both, to provide a smooth surface on which the liner can slide on insertion into or removal from the housing to prevent scratching of the nose liner and/or housing. TEFLON® is preferred because it can withstand 250° C. temperatures, it does not outgas unwanted contaminants and is compatible with various aggressive cleaning solutions. However, screws or plugs formed of other materials possessing these characteristics can be used effectively.

Referring to FIG. 4, a turbopump 118, or other high vacuum pump, is mounted to an outlet port 116 of the pumping nose. A gate valve 120 is disposed between the turbopump and the nose to enable selective communication of the turbopump with the chamber. The turbopump enables the vacuum chamber to be evacuated down to a very low pressure to be compatible with processing platforms such as an Endura® platform available from Applied Materials, Inc. of Santa Clara, Calif. An exhaust pump such as a roughing pump, dry pump or other pump used in the industry is connected to the chamber at the exhaust port 114 in the nose to pump the chamber during processing. A cold trap 140 is disposed in the conduit connecting the exhaust pump to filter out the deposition material which may be detrimental to the pump. Additionally, a second cold trap 142 is disposed below the first cold trap and is connected to a bypass line from the vaporizer. The bypass line and related cold trap allow the system to operate in a continuous flow made by allowing delivery of vaporized material thereto during wafer transfer.

Figure 13:
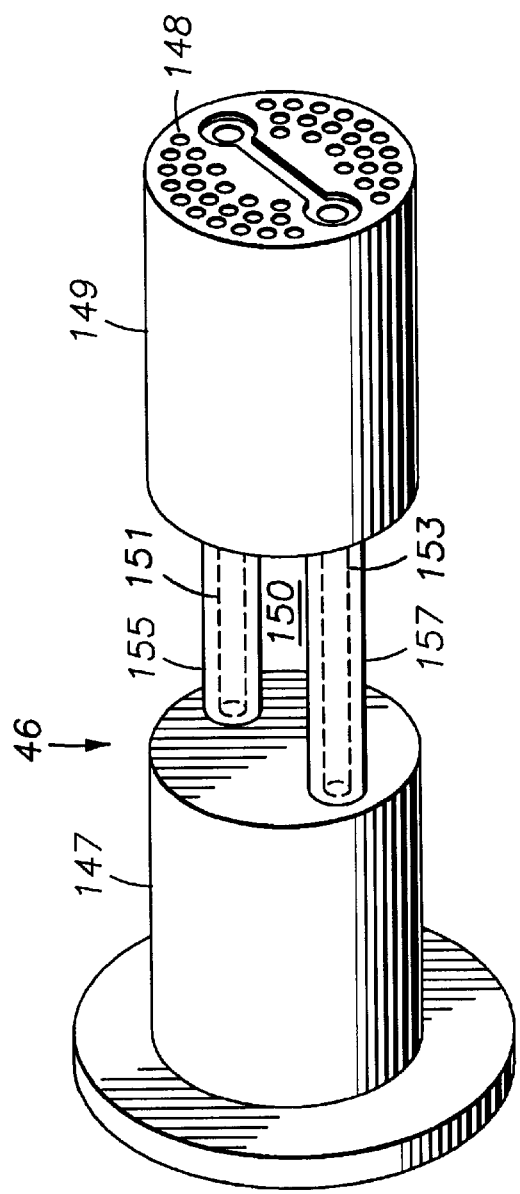
FIG. 13 is a perspective view of a cold trap filter member.

FIG. 13 is a perspective view of a cold trap filter of the present invention. The cold trap is housed in a tubular housing 144 (shown in FIG. 1) and includes a filtering member 146 which includes a plurality of cooled passages 148 for condensation of material thereon. The filtering member includes a base portion 147 and a filtering portion 149. The filtering portion 149 includes the plurality of cooled passages 148 formed therein. A water inlet 151 and water outlet 153 are disposed in conduits 155, 157. The gases pass through the filtering member and continue through an exhaust passage deposed in communication with a central portion 150 of the filtering member. This structure enables gases to pass through the filtering portion 149 and on through the exhaust system. The housing 144 mounts a conduit connected to the exhaust pump having an inlet fluidically connected to the central chamber portion 150 so that the gases pass through the cold trap and continue on through the conduit to a disposal system.

A purge gas arrangement provides a purge gas in the lower part of the chamber resulting in a gas shield with upwardly directed flow of gas emanating from the bottom of the chamber. The gas shield strength is adjustable with a mass flow controller. Suitable purge gases include helium, argon and nitrogen, which can be introduced through a purge line and a circular manifold for distributing the gas evenly about the substrate support member and the elevator shaft, within the sealing bellows. The gas flow rate must be set relatively low, e.g., 50 sccm, in order to avoid interference with the deposition process. Additionally, the purge gas is directed into the exhaust plenum adjacent the liner and away from the edge of the wafer.

The Vaporizer

Figure 14:
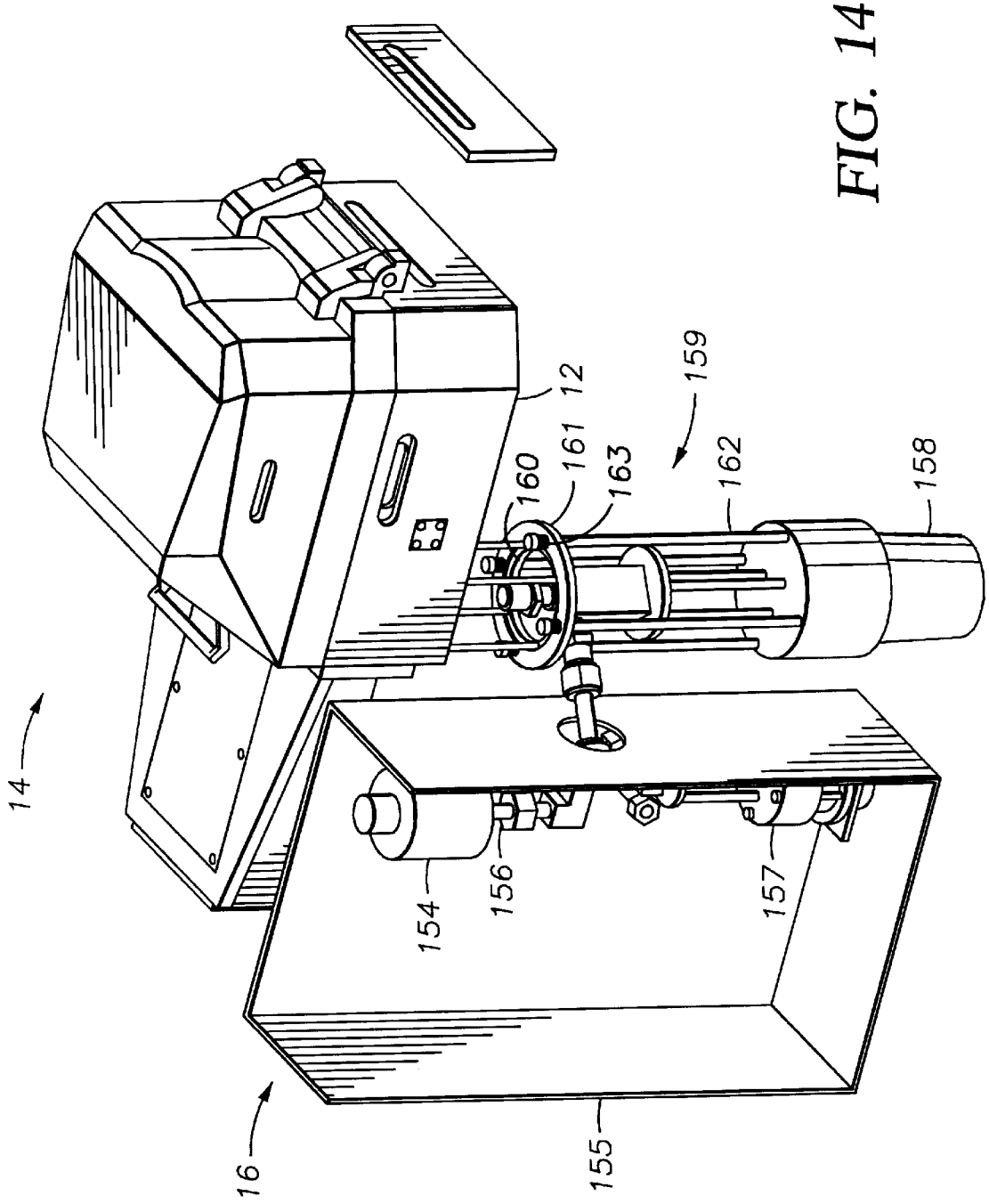
FIG. 14 is a perspective view of a chamber and vaporizer module.

FIG. 14 is a perspective view showing the vaporizing module 16 mounted adjacent to the chamber 12. A vaporizer 154 is mounted in a vaporizer cabinet 155 and includes an outlet line 156 connected to the inlet into the chamber. Disposed along the outlet line 156 is a first valve 157 which is connected in turn to a bypass line (not shown) extending out through the back of the cabinet 155 and is connected to the exhaust system by a conduit in which the cold trap 142 is disposed (see FIG. 1). The bypass line is adapted to deliver both vaporized gas as well as liquid solvent into a cold trap disposed downstream from the valve in preparation of delivering vaporized gas to the chamber or during cleaning of the system. This valve controls delivery of the vaporized material to the chamber or through the cold trap in the exhaust system. A second valve 158 is disposed downstream from the first valve to selectively deliver the vaporized gas into the chamber. The second valve is mounted to the lower portion of the chamber via a rod and washer assembly 159. This assembly enables adjustment of the delivery line as well as the valve in relation to the chamber. The mount generally includes first and second rings 160, 161, respectively, one disposed in the other, to allow rotatable adjustment of a second value 158 and the delivery line. The isovalve 128 is mounted to the second ring 161 via a plurality of rods 162 (four shown here) which are mounted from the ring and include a spring 163 disposed above the upper portion of the rod and the second ring 161. The two rings 160, 161 enable rotation of the assembly while the spring and rod arrangement allow vertical adjustment of the assembly to ensure proper alignment of the gas feed line 156 into the chamber through the feedthrough 40, shown in FIG. 2. In general, the suspension apparatus provides automatic compensation for thermal expansion/contraction to maintain vacuum seals without the mechanical and thermal stress.

Figure 15:
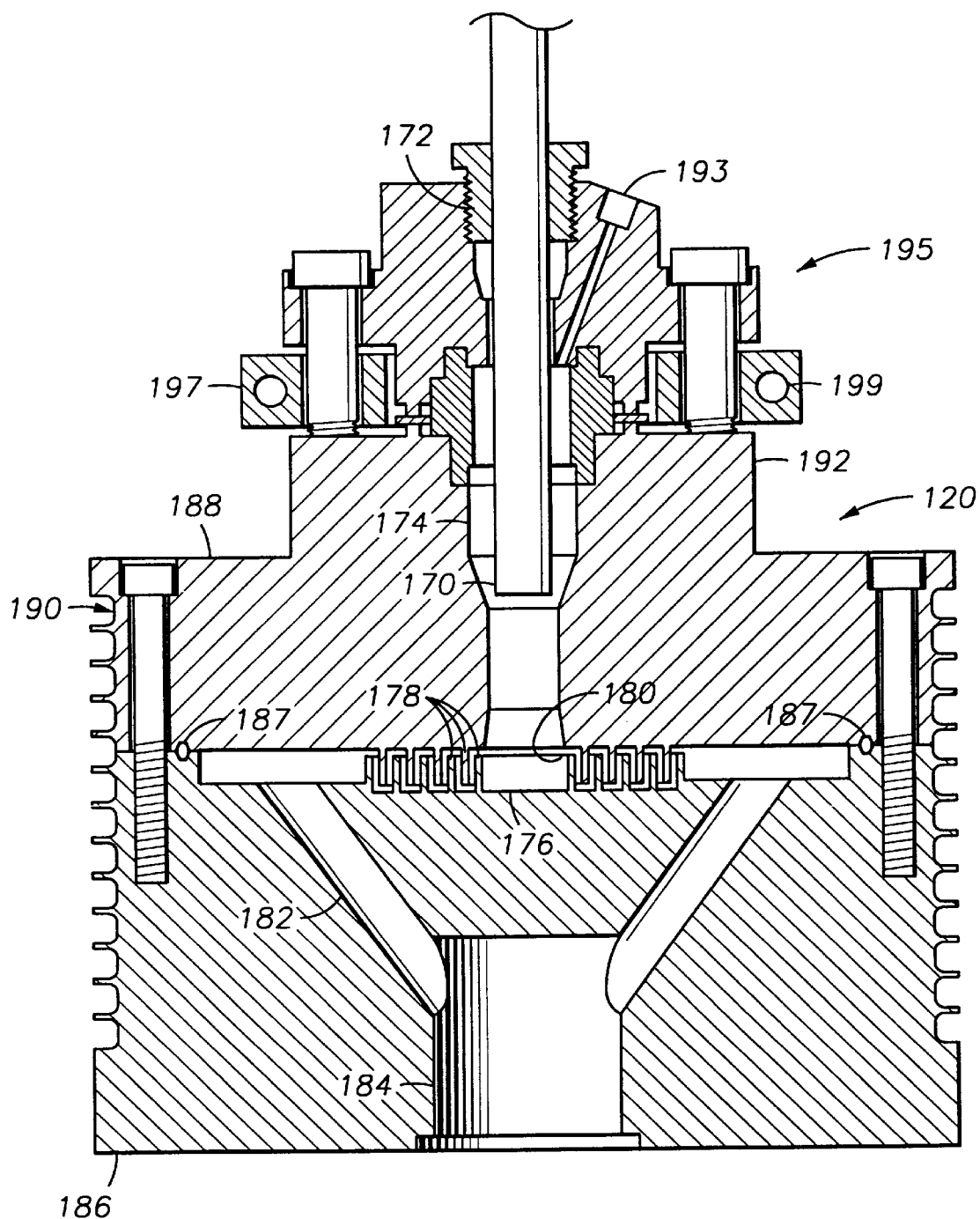
FIG. 15 is a cross sectional view of a vaporizer of the present invention.

FIG. 15 is a cross sectional view of one embodiment of a vaporizer 154 of the present invention. The vaporizer generally includes an injection nozzle 170 disposed through an inlet port 172 of the vaporizer. A concentric passage 174 is disposed about the outer perimeter of the gas injection nozzle 170 to deliver one or more carrier gases to the tip of the nozzle. Preferably, the concentric gas passage is made of PTFE for low friction coefficient and prevention of clogging. The carrier gases are flown concentrically about the nozzle to prevent liquid droplets from forming on the tip of the nozzle and moving up the outer cylinder of the nozzle. The liquid delivered to the nozzle 170 is carried in a carrier gas, such as argon, and delivered to a central cup-shaped portion 176 of the vaporizer. The cup-shaped portion of the vaporizer forms the central receptacle for the liquid injection stream where vaporization commences. A plurality of fins 178 are disposed around the central cup-shaped portion 176 to define a tortuous path or labyrinth along which vaporization occurs. The fins 178 are spaced from one another in rings which are offset to form the path along which the gas vapor diffuses and are spaced a sufficient distance to reduce the likelihood of clogging. One or more notches 180 are formed in the upper portion of the fins to define a gas flow passage which allows gas flow but which enables the fins to trap any liquid which is not vaporized. This prevents liquids from passing through the vaporizer and into the chamber, as well as enabling a solvent to be delivered into the vaporizer for cleaning without the risk of having the solvent enter the chamber.

Connected with the circular path defined between the outermost circle of fins and internal cylindrical wall surrounding the vaporizer section are a plurality of ports 182 (e.g., six) and associated gas delivery passages converging to a main outlet 184. The arrangement of angled ports 182 provide a large conductance for shorter resonance time in the vaporizer and also facilitate inspection and cleaning of the vapor flow paths. All of the passages are surrounded by a large solid mass of a lower block 186 and an upper block 188 which are assembled together to form the vaporizer and include a metal-to-metal seal 187. The upper and lower blocks define grooves 190 to mount heating elements. This arrangement helps to ensure that the vaporizing surfaces as well as the vapor are maintained at the optimum isothermal temperature downstream of (as well as in) the main vaporizing section.

Figure 16:
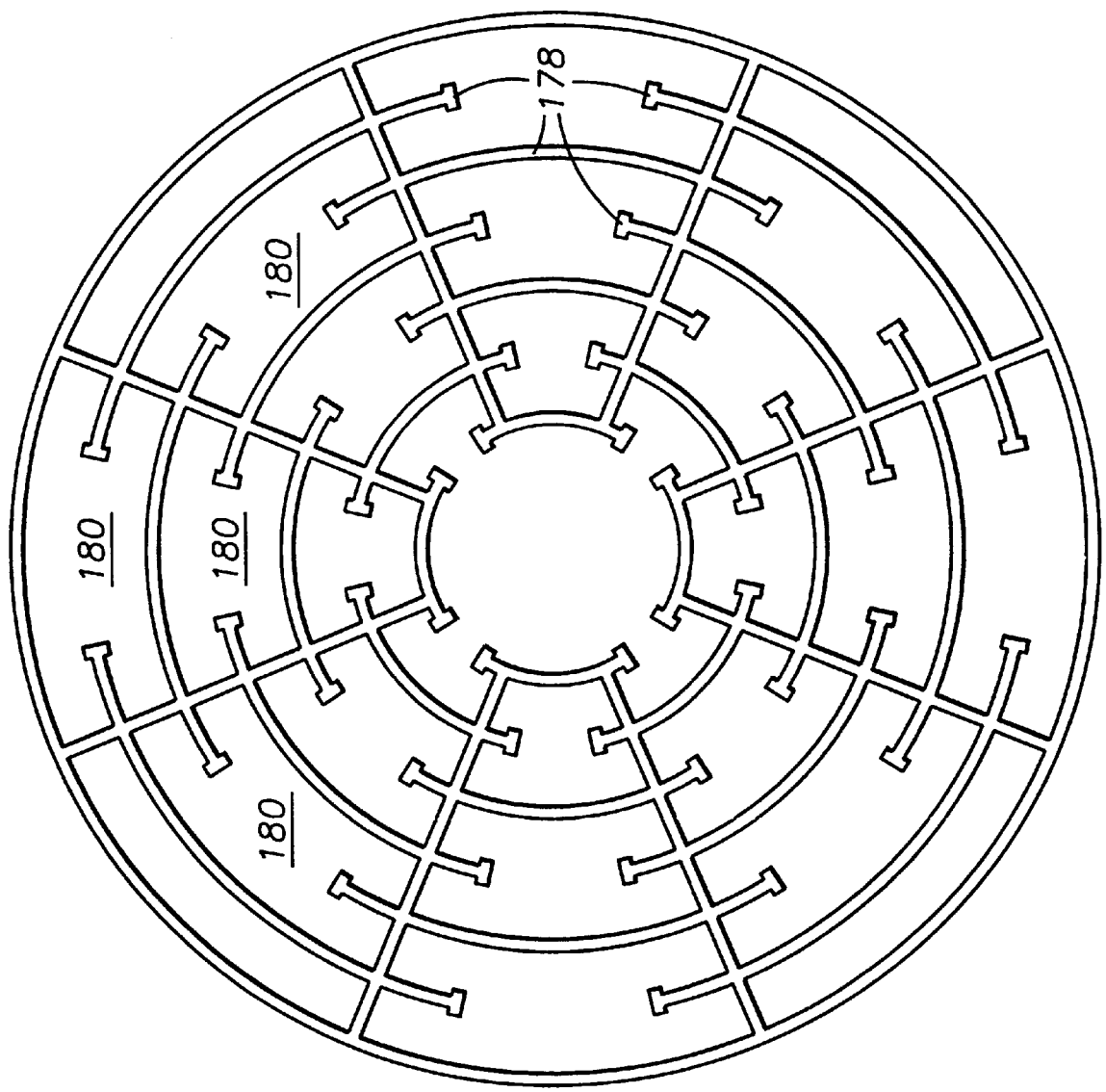
FIG. 16 is a top schematic view of a fin structure of the vaporizer of the present invention.

The fins 178 of the vaporizing section are preferably formed as integral parts of the upper and lower block, and not as separate attached parts. Thus, in contrast to previous designs, the heating surfaces do not constitute thermally "floating pieces," i.e., pieces whose temperature "floats" or varies (less controllably) in relation to the temperature of one or more separate thermal masses to which the pieces are attached. In a preferred embodiment, respective sets of fins are machined directly into the mating surfaces of the upper and lower blocks in complimentary configurations which interleaf or interdigitate with each other to form the multi-path, maze-like structure shown in FIG. 16. In addition to their vaporizing function, the twists and turns of the pathways of the main vaporizing section also serve to vigorously mix the precursor components and carrier gases and to filter out entrained droplets by impaction as the carrier gas changes direction in the labyrinth.

The radial spacing between the concentrically arranged fins is preferably about 0.5 mm (0.020"), in order to minimize the effects of any deposits which might form. A preferred radial spacing is within the range of about 1–3 mm (0.039–0.118"), and most preferably about 2 mm. In a preferred embodiment, the circular fins have a height of about 2–8 mm and a density of 2–6 fins per inch (measured in the radial direction). The overall inner diameter of the preferred main vaporizer section is 75 mm, and 6 concentric circles are provided with a radial spacing of about 2 mm. Each of the circles has four fins; the size and circumferential (end-to-end) spacings of the fins varies directly with the diameters of the circles. Maximum and minimum end-to-end spacings of the fins are 30 mm and 2 mm, respectively, depending on carrier gas flow, the vaporization behavior of the precursors and thermal stability of the precursors. The spacing between the fins is important to prevent clogging of the vaporizer and to provide maximum surface area on which vaporization can occur. The precursors with low volatility require relatively high conductance and fewer fins. Precursors with low thermal stability require relatively short resonance time and therefore high carrier gas flow, a short flow path and fewer fins. Precursors with violent or droplet generating boiling phenomenon require relatively higher numbers of fins to enhance impaction filtering of the droplets.

An important feature of the vaporizer assembly is the arrangement provided for delivery of the liquid precursor mixture to the main vaporizing section, and for mixing the precursor liquid with the carrier gas. The mixture of liquid precursor components is delivered through the nozzle 170 or capillary tube (e.g., 2–20 mil inner diameter) to a point just above the center of the main vaporizing section. The liquid and gas are supplied at a relatively high flow rate, e.g., 10 ml/min. liquid and 100–2000 sccm gas, which causes the liquid to exit the capillary tube and enter the main vaporizing section as a jet of liquid and gas with a high nozzle velocity. Importantly, all but a final short segment of the path of the liquid mixture is kept relatively cool by a thermal choke structure 195 to reduce thermal decomposition of the liquid precursor components prior to vaporization. In particular, the capillary tube extends within a relatively thin tube or neck 192 attached to or forming an integral part of the upper block as shown in FIG. 15. Thermal insulation of the capillary tube along this stretch is provided by the relatively thin wall of the neck, e.g., 10–100 mil thickness, as well as by the space between the capillary tube and surrounding internal surface of the neck and by the thermal insulating value of the material. The neck is preferably made of PTFE, stainless steel or other material having a relatively low thermal conductivity. A cooling block 197 and cooling channel 199 enable temperature control of the nozzle 170.

The liquid precursor components are mixed with a concentrically delivered carrier gas as the former is jetted-out of the capillary tube just above the main vaporizing section. The concentrically delivered carrier gas is delivered to this point by a supply line 193 or tube fluidly connected, e.g., with a standard VCR fitting, with an upper part of the internal bore of the neck. The gas flows downwardly within the passage 174 defined between the injection nozzle 170 and the internal neck surface. At the level of the nozzle outlet, the carrier gas picks-up the liquid precursor mixture jetting-out of the capillary tube and carries the mixture down into the main vaporizing section 176 where the liquid precursor is vaporized. To allow for optimization of this initial "flash" vaporization, the spacing between the injection nozzle 170 and the main vaporization section 176 is preferably adjustable. For example, the capillary tube can be made axially movable within a thermal choke structure 195 mounted within the central neck bore. Adjustment of the flash vaporization to avoid a liquid droplet "dance on the frying pan" effect is obtained by adjusting the flow rate of the gas and liquid precursor mixture. Any liquid droplets remaining after the initial "flash" vaporization are vaporized as the mixture advances through the tortuous paths of the main vaporizer section, in contact with the heated fins. The resultant deposition gas then passes through the ports and angled ports 182 to the central main outlet 184, and through the vaporizer outlet port for direct delivery to the deposition chamber. The mixture is substantially maintained at the predetermined optimum isothermal system temperature (e.g., 250° C.±5°). The exit ports are designed for large conductance so that precursor vapors are readily carried from the vaporizer into the chamber.

The vaporizer operates to vaporize a mixture of precursor components, such as BST, and a carrier gas by providing a main vaporizer section with increased surface area provided along a tortuous pathway which expose the mixture to a large area of evenly heated surfaces and filter out liquid droplets entrained in the flow by droplet impaction during changes in gas flow direction in the tortuous path. The flow velocity, and therefore impaction filtering efficiency, is independently controlled by the flow of an auxiliary argon or other carrier gas input to he vaporizer injection plumbing. In contrast to conventional arrangements, the amount of heating, e.g., vaporizing, power supplied to the mixture is set substantially higher than the level of power actually required to achieve complete vaporization. The amount of power required for complete vaporization is a function of the chemistry of the precursor components and carrier gas, and the flow rate of the mixture. As one example, with a BST flow rate of 0.10 ml/min and a carrier gas, e.g., Ar, flow rate of 200–300 sccm, the amount of power necessary to heat and completely vaporize the flow is approximately 10 W. As will be understood, a metering valve can be used to control the amount of gas flow in direct relation to the flow rate of the liquid precursor component mixture.

In accordance with the invention, the thermal power transferred to the vaporizer is set to be one to two orders of magnitude higher than the 10 W required for complete vaporization of the mixture, i.e., between about 100 W and 1000 W, and preferably 20–30 times higher, i.e., 200–300 W. In this manner, the heating power absorbed by the flowing mixture is a small fraction of the heating power which is available. Therefore, the power absorbed by the gas vapor presents an insignificant perturbation in relation to the available heating power, making it possible to substantially maintain an ideal isothermal temperature (e.g., 250° C.±5°) of the heating surfaces. In general, depending on the precursor component mixture which is used, the ideal isothermal system temperature will be in the range of about 200–300° C.

Also, the vaporizer body is configured to help ensure the maintenance of an isothermal temperature of the main vaporizing section. Specifically, the heating surfaces are preferably integrally formed in adjoining surfaces of upper and lower blocks of metal, e.g., aluminum or stainless steel. The blocks provide a relatively large thermal mass for retention and transmission of thermal energy generated by one or a pair of heating elements surrounding the blocks. In a preferred embodiment, the upper and lower blocks are provided as segments of a cylindrical rod and one or a pair of heating elements, such as a cable heater, are wrapped helically about the circumference, and along the lengths, of the rod segments.

As one specific example, the top and bottom cylindrical blocks may each have an outer diameter of 3.5". The top segment may have a length of 1", and the bottom segment a length of 2". The segments may be bolted together by a plurality of bolts, e.g., eight, extending in an axial direction and equally spaced around the perimeter of the blocks. Preferably, the segments are sealed to each other with a known type of high temperature metal-to-metal seal situated in a circular groove provided in one or both of the blocks and surrounding the main vaporizer section. One example of a metal-to-metal seal is the aluminum Delta seal from Helicoflex.

The heating elements preferably deliver a total heating power of between about 1000 W and 3000 W to the blocks. If separate heaters are used to heat the top and bottom segments, a 1500 W bottom heater and a 675 W top heater may be used to provide a total heating power of 2175 W. Helical grooves (not shown) are preferably formed on the outer surface of the blocks and the heating elements are secured in the grooves, e.g., by welding. The heater is controlled to maintain the main vaporizing section at the optimum isothermal temperature by a conventional PID controller. The controller is connected with a thermocouple positioned within one, and preferably both, of the upper and lower segments directly adjacent the heated vaporizing surfaces.

Figure 17:
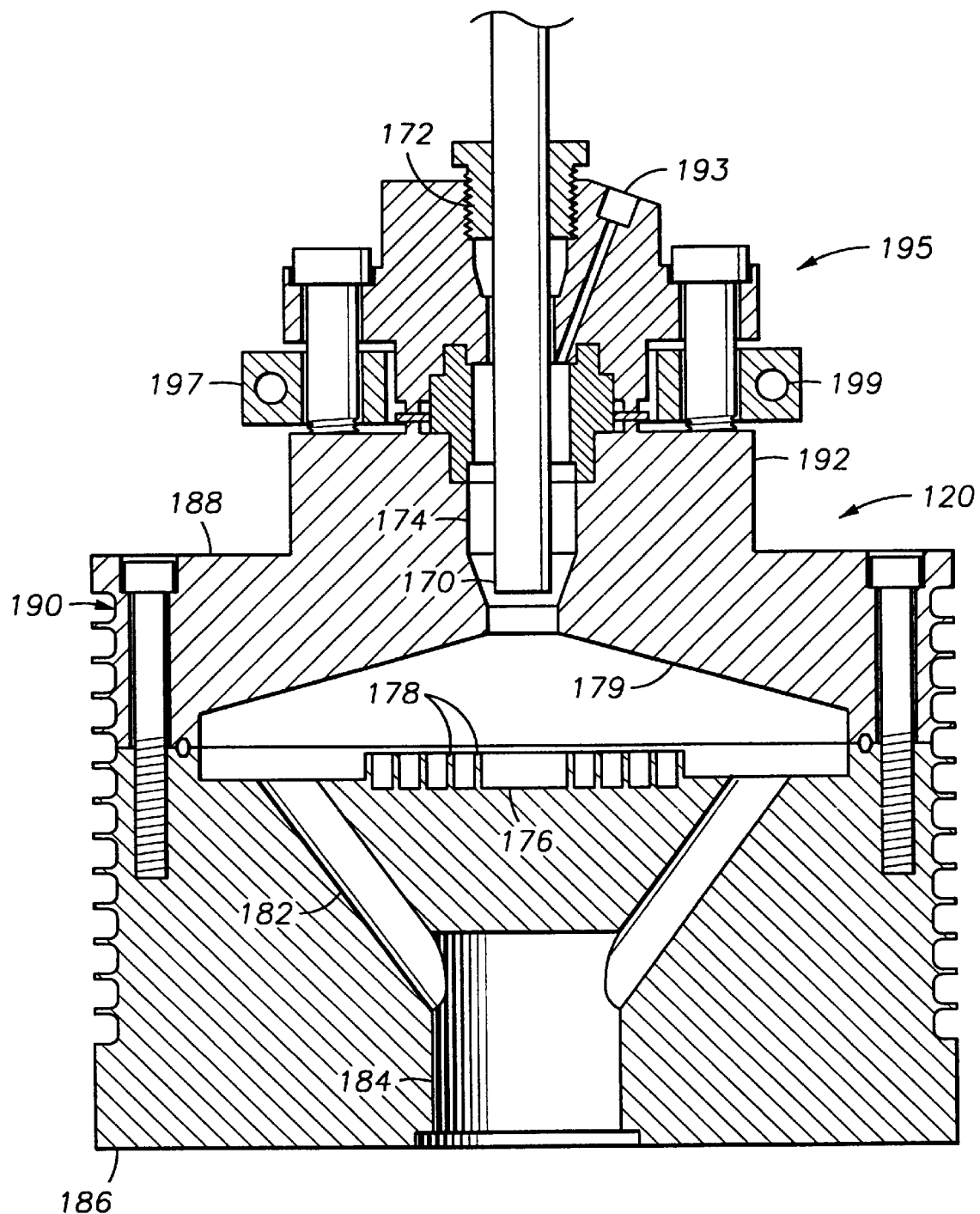
FIG. 17 is a cross sectional view of an alternative embodiment of a vaporizer.

In an alternative embodiment shown in FIG. 17, the upper and lower block do not provide interdigitating fins, but rather provide a fin structure 178 is disposed only on the lower block. The upper block defines an upper roof 179 of the vaporizing chamber. The fins 178 are spaced from one another and include passages therethrough to enable flow of vaporized gas through the fin structure and out through the outlets. It is believed that this arrangement enables greater conductance of vaporized gas and to reduce resonance time in the vaporizer.

Applications of the System

Exemplary metal-oxide layers which can be deposited using the present system may include tantalum pentoxide ($Ta_2O_5$), a zirconate titanate (ZrxTiy Oz ), strontium titanate ($SrTiO_3$), barium strontium titanate (BST), lead zirconate titanate (PZT), lanthanum-doped PZT, bismuth titanate ($Bi_4Ti_3O_{12}$), barium titanate ($BaTiO_3$), BST, PZT, lanthanum-doped PZT, or the like. Other materials which can be deposited include those materials having a narrow range between vaporization and decomposition.

Substrates used in the present invention include primarily P-type and N-type silicon. Depending on the particular process chemistry and desired end product, other substrate materials may be usable, including other semiconductors, e.g., germanium, diamond, compound semiconductors, e.g., GaAs, InP, Si/Ge, SiC, and ceramics.

The selection of materials for the layers above the circuit element in an integrated circuit device depends on the device that is formed and other layers that a particular layer currently or subsequently contacts. For example, a DRAM requires a high permittivity capacitor, but the metal-oxide dielectric layer does not need to have ferroelectric properties.

Devices that can be made with the present system include, but are not limited to, 64 Mbit, 256 Mbit, 1 Gbit and 4 Gbit DRAMs.

The system also has particular application with other liquid precursors which are volatile as well as materials such as copper.

Liquid Delivery System

Figure 18:
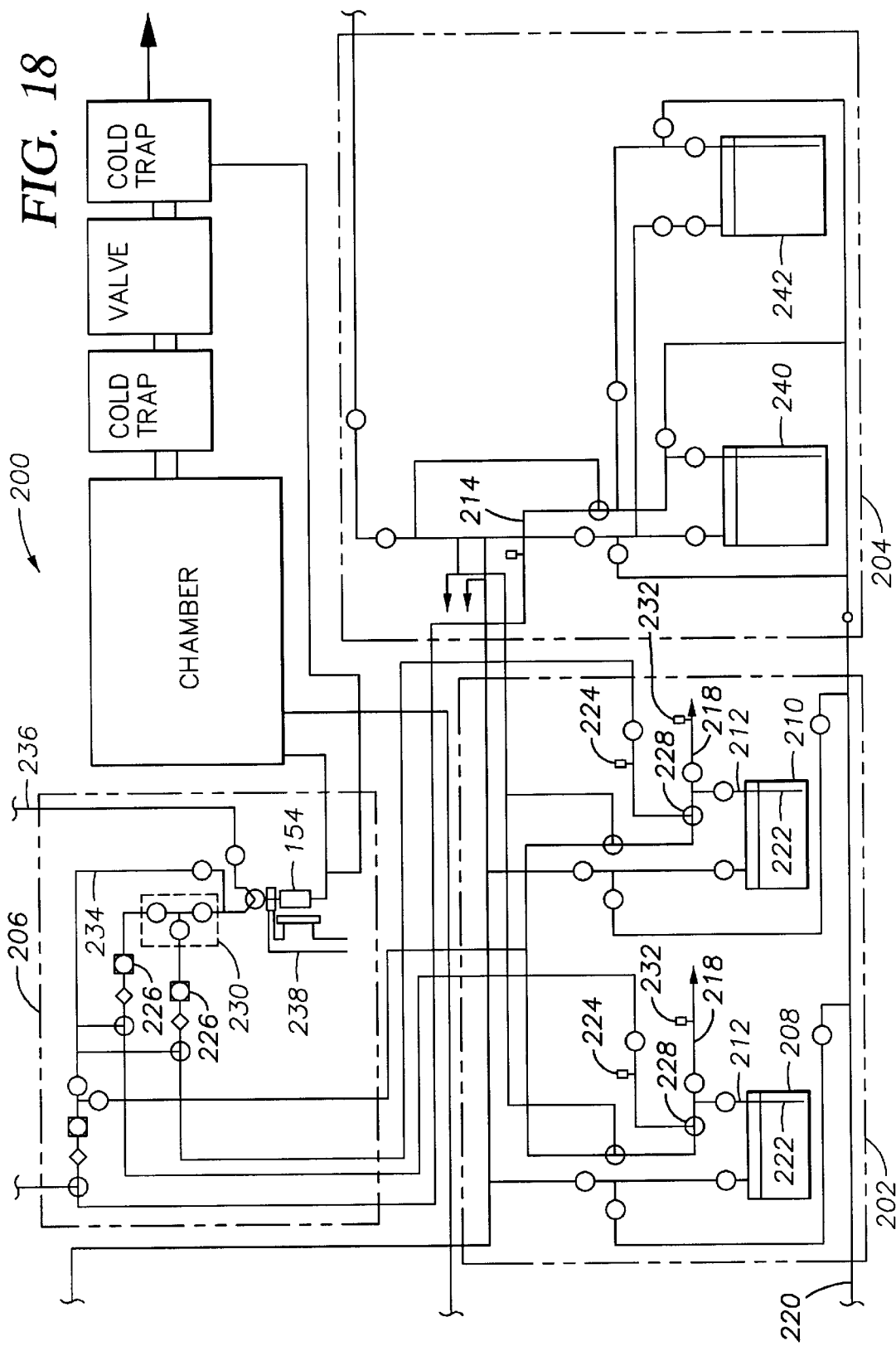
FIG. 18 is a schematic of a liquid delivery system.

FIG. 18 is a perspective view showing a liquid delivery system 200 of the present invention. The liquid delivery system generally includes a liquid precursor module 202, a solvent module 204 and a vaporizer module 206. In one embodiment, the liquid precursor module 202 includes two pressurized ampoules 208, 210 and a liquid delivery line 212 connected to each ampoule. Valves are disposed along the length of the liquid delivery lines to control flow of liquid from the ampoules to a mixing port and then into the vaporizer. Preferably, zero dead volume valves, which are described below, are used to prevent collection of precursor therein which can compromise the valves as well as negatively affect process stabilization and/or repeatability. The zero dead volume valves enable rapid flushing of precursor from the lines using solvent. Solvent is plumbed to the liquid delivery line 212 by line 214 to flush the system during maintenance. Additionally, a purge gas line is plumbed to the liquid delivery line to rapidly purge solvent from the line so that the system, including the ampoules, valves and/or LFCs, can be prepared for maintenance in ten (10) to thirty (30) minutes. The valving is designed so that when necessary, solvent can be introduced into the liquid delivery line upstream form the mixing port to flush the line through a bypass line 218 and out through a recovery system which includes a cold trap and exhaust manifold.

The ampoules are designed to deliver the liquid precursors at high pressure, e.g., up to 500 psi, without having to rely on high pressure pumps, i.e., no high cycle mechanical pump with rubbing parts exposed to precursors. To provide the pressure, an inert gas such as argon is charged into the ampoules at a pressure of about 90 psi through line 220. A liquid outlet line 222 is disposed in the ampoule so that as the inert gas, e.g., argon, is delivered to the ampoule and the appropriate valves are opened, the liquid is forced out through the outlet through a suitable valve and into the liquid delivery line.

The liquid delivery line 212 is connected from each ampoule to the vaporizer. A first zero dead volume valve is disposed on the outlet of the ampoule to control delivery of the liquid to the delivery line 212. The valve is preferably a three-way valve connecting the bypass line 218 and the liquid delivery line 212. The bypass line 218 in turn is connected to a cold trap and an exhaust manifold (not shown). A high pressure gauge 224 and a LFC 226 are disposed downstream from a valve 228 introducing the solvent and the purge gas. The LFC controls delivery of the liquid to the mixing port 230 connected between the liquid precursor delivery lines. A low pressure gauge 232 is disposed on the bypass line 218 to monitor pressure in the line so that completion of the maintenance routine can be determined.

The liquid precursor delivery lines 212 deliver liquid precursors into the mixing port 230 upstream from the vaporizer 154. A solvent delivery line 234 also delivers a solvent into the liquid delivery line downstream from the mixing port where the liquid precursors and the solvent are mixed and delivered into the vaporizer. At the vaporizer, a carrier gas line 236 delivers a carrier gas into the delivery line to carry the liquid precursors and the solvent into the vaporizer through the capillary tube or nozzle. In addition, a concentric carrier gas line 238 delivers a carrier gas around the nozzle or injection tip to ensure that even a small amount of liquid is delivered to the vaporizing surfaces. The delivery line from the mixing port and into the vaporizer is preferably made of a material having a low coefficient of friction, such as TEFLON® PTFE, and does not hang up in the line. This feature assists in the delivery of small volumes of liquid precursor.

The solvent module 204 includes one or more chargeable ampoules similar to the liquid precursor ampoules. Preferably, there are two solvent ampoules 240, 242 and two liquid precursor ampoules 208, 210. The liquid precursor ampoules can deliver two separate precursors which can be mixed at the mixing port or can deliver the same precursor together or alternatively.

The liquid precursor ampoules are designed with a slotted/sculptured bottom to draw the liquid downwardly in the ampule so that the liquid may (1) be detected at very low levels and (2) be drawn out of the ampule even at low levels. This is particularly important in dealing with expensive liquids which are preferably not wasted. In addition, the ampoules include an ultrasonic detector for discerning the volume of liquid in the ampoule even at low levels so that continuous processing may be achieved.

Figure 19:
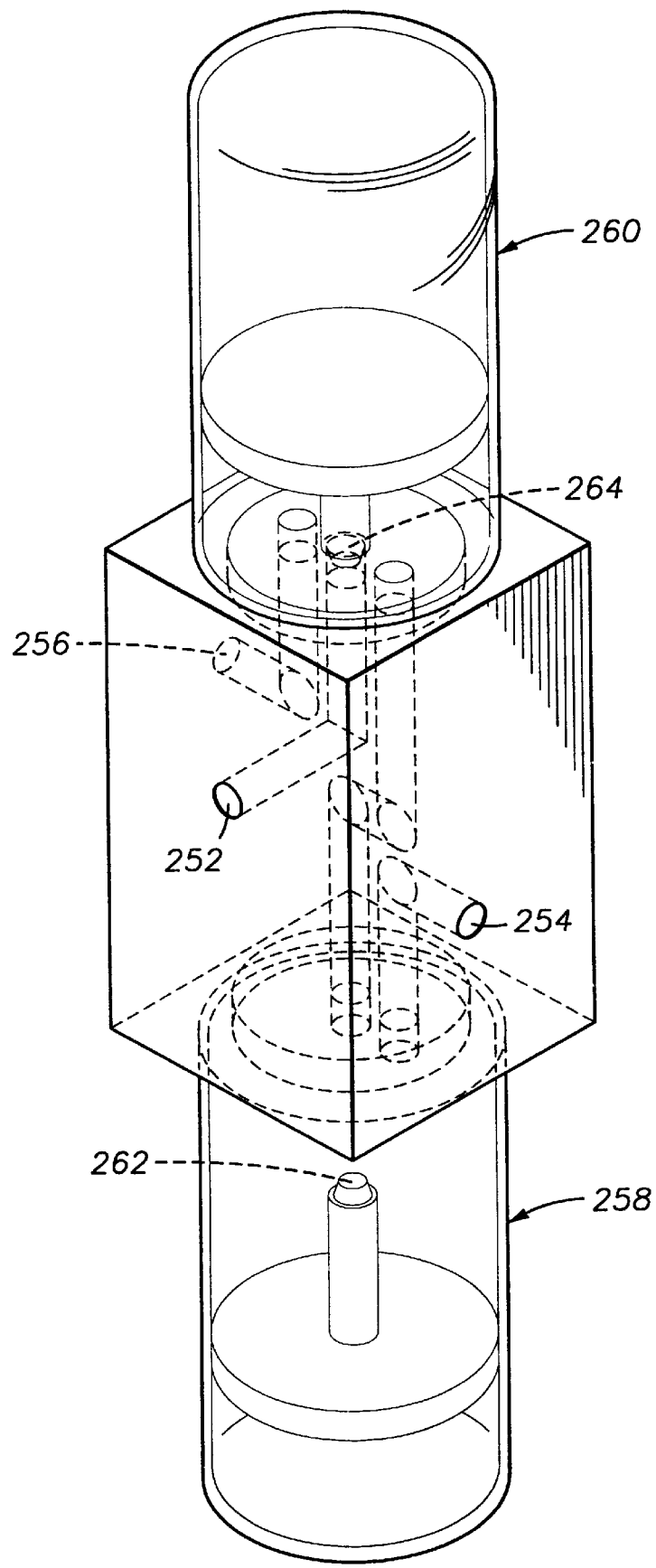
FIG. 19 is a perspective view of a zero dead volume valve.
Figure 20:
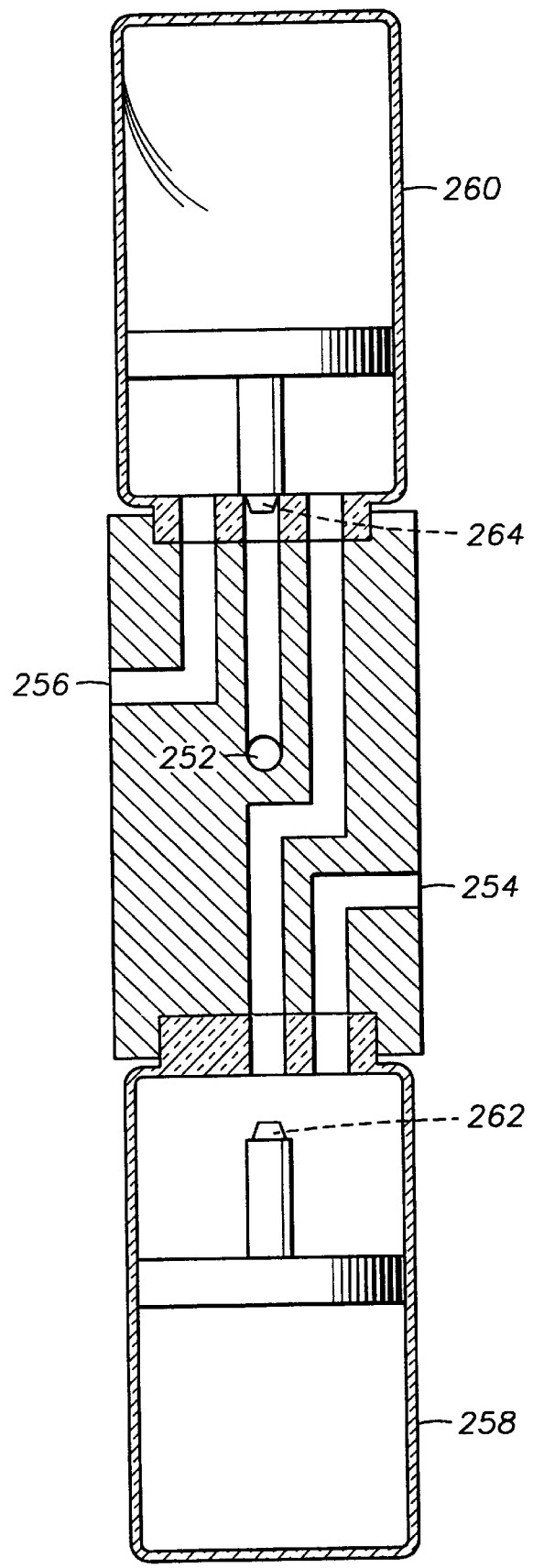
FIG. 20 is a cross sectional view of a zero dead volume valve.

FIG. 19 is a perspective view of a zero dead volume valve. The valve includes a liquid precursor inlet 252 and a solvent inlet 254 and a single outlet 256. The solvent is routed through the solvent inlet through a solvent control actuator 258 and into the liquid precursor control actuator 260. A plunger 262 controls entry of the solvent into and consequently out of the solvent control actuator as shown in FIG. 20. The liquid precursor is routed through the precursor inlet 252 and into precursor control actuator 260 when the plunger 264 in the actuator is in the open position. When the plunger is in the closed position, the precursor is prevented from entering the actuator and is flushed out of the valve by the plunger and by flow of solvent through the valve. The solvent is able to enter the precursor control actuator 260 whether the plunger is in the open or closed position to enable solvent purge of the valve as shown in FIG. 20. The plunger is contoured to seal the liquid precursor inlet while enabling solvent flow into the actuator. Continuous solvent flow allows the system to be continuously purged with solvent when the liquid precursors are shut off.

Additionally, a single actuator valve is disposed on the outlets of the ampoules to control delivery of liquid precursor and to prevent clogging in the actuator. Also, the two way valves are preferably disposed on the downstream side of the liquid flow controllers in the vaporizer panel.

The delivery tubes are preferably made of a material such as TEFLON® to promote frictionless fluid flow therein to prevent clogging and deposition along the path of the tubes. It has been learned that TEFLON® provides a better conduit for materials such as the barium, strontium and titanium precursor liquids used in the deposition of BST.

The plumbing system is designed to enable rapid flushing of the lines and valves during routine maintenance. Additionally, the system is adapted to enable sequential shutdown of each of the valves as well as to deliver an automatic flush of a controlled amount of solvent through the vaporizer and the delivery lines in case of a power outage. This safety feature ensures that during uncontrolled power outages, the system will not be subject to clogging.

The delivery system may also comprise a bubbler system where a carrier gas such as argon can be bubbled through a solvent to suppress premature solvent evaporation from the precursor, thereby ensuring the precursor liquid will not be dried out en route to the vaporizer.

In situ liquid flow controllers and pisoelectric control valves are also used to maintain heightened control over the system. The high pressure gauges present on precursor and solvent lines as well as vacuum gauges on the vacuum manifolds are used to measure whether chemicals remain in the lines. These gauges are also used for on board leak integrity measurements.

A preferred embodiment of the present invention includes a liquid CVD component delivery system having two pressurized ampoules of liquid CVD component and a related LFC, such as a needle valve, which operates without sliding seals and can be used at pressures of less than 250 psi. Two solvent ampoules deliver solvent into the liquid delivery lines for cleaning and maintenance as well as into the mixing port during processing.

BST Process

The vapor desired for use in the deposition process is shown as a mix of first and second vaporized liquid precursors combined in predetermined mass or molar proportions. For use in deposition of BST, the first liquid precursor is preferably one of a mixture of Ba and Sr polyamine compounds in a suitable solvent such as butyl acetate. The preferred mixtures combine bis(tetra methyl heptandionate) barium penta methyl diethylene triamine, commonly known as Ba PMDET $(tmhd)_2$, and bis(tetra methyl heptandionate) strontium penta methyl diethylene triamine, commonly known as Sr PMDET $(tmhd)_2$, or, in the alternative, bis(tetra methyl heptandionate) barium tetraglyme, commonly known as Ba $(tmhd)_2$ tetraglyme, and bis(tetra methyl heptandionate) strontium tetraglyme, commonly known as Sr $(tmhd)_2$ tetraglyme. The second liquid precursor is preferably bis(tetra methyl heptandionate) bis isopropanide titanium, commonly known as Ti $(I-pr-o)(tmhd)_2$, or other titanium metal organic sources, such as $Ti(tBuO)_2(tmhd)_2$. The molar ratio between the combined metals in the first liquid precursor and the second liquid precursor is preferably about 2:1:4 Ba:Sr:Ti. The molar ratio can vary from about 2:1:2 to about 2:1:8.

The BST process mixes the vaporized first and second liquid precursors with an oxidizing gas such as oxygen, $N_2O$, $O_3$ or combinations thereof, at a temperature above the vaporization temperature of the precursors and below a temperature which degrades the components. The process is very sensitive to changes in temperature of the substrate, solvent content of the liquid precursors, and concentration of the oxidizer in the combined gases. Increasing the wafer temperature increases the deposition rate, reducing the solvent content of the liquid precursors reduces the haze of the films, and controlling the oxidizer flow rate controls the roughness of the film and crystalline phase.

Figure 21:
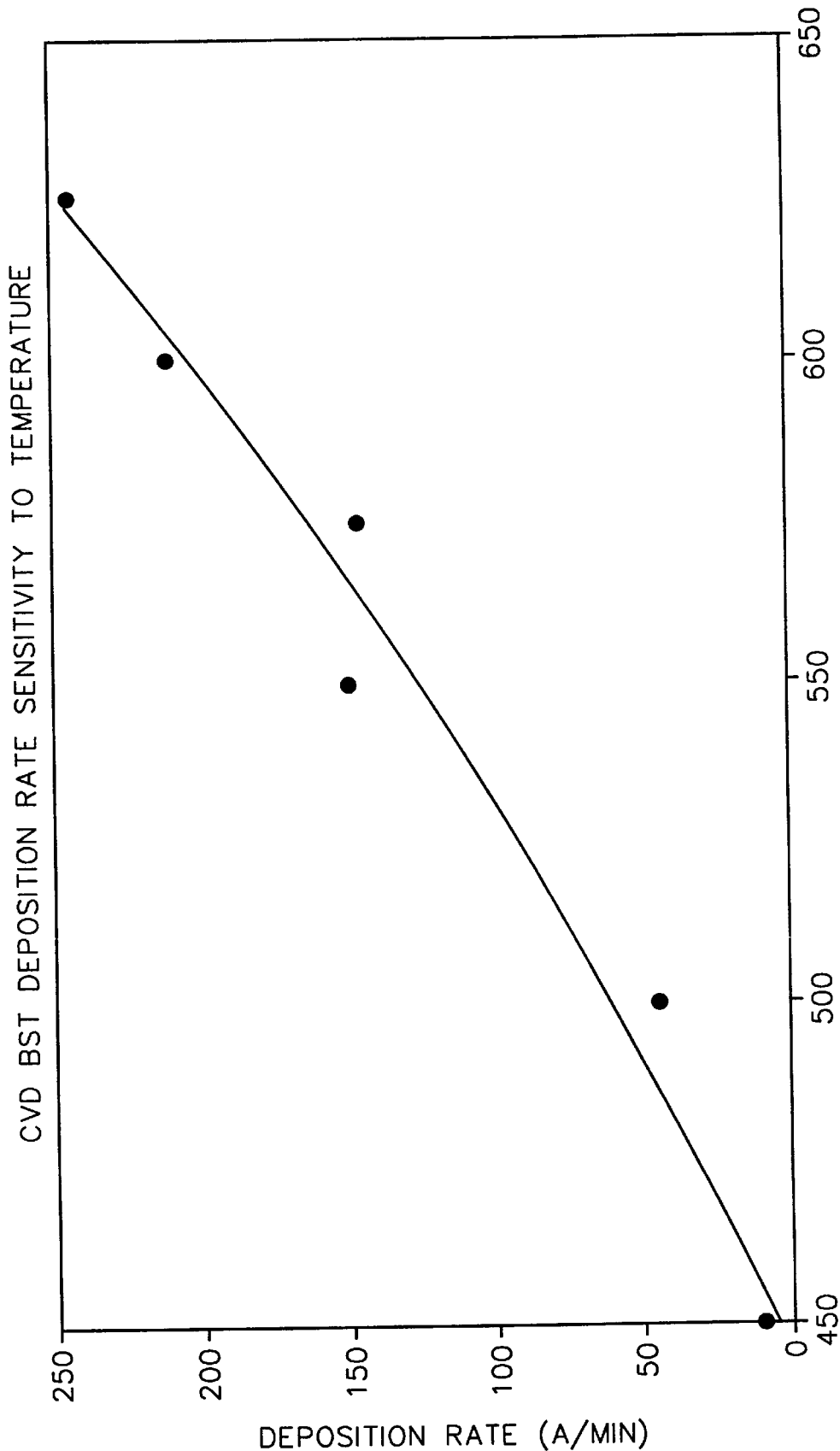

FIG. 21 is a graph of the deposition rate versus heater temperature in a CVD BST 200 mm substrate process of a preferred embodiment of the present invention. A heater temperature of 600° C. provides a high deposition rate without substantial degradation of the precursors. The heater temperature can vary from about 300° C. to about 800° C. For the examples shown in FIG. 21, the first precursor was a mixture of Ba PMDET $(tmhd)_2$ and Sr PMDET $(tmhd)_2$ in butyl acetate having a molar ratio of Ba: Sr of 2:1. The second precursor was Ti (I-pr-o) $(tmhd)_2$ in butyl acetate which provides a molar ratio of Ba:Sr:Ti of 2:1:4. The substrate was a $Pt/SiO_2/Si$ substrate. A deposition rate of 220 Å/minute was achieved at a heater temperature of 600° C. using a total liquid flow rate of the precursors at 200 mg/m and a process gas flow rate of 1500 sccm (that is, a combination of oxygen, nitrogen and argon, each at a flow rate of 500 sccm). A vaporizer according to the present invention was also used, wherein the vaporizer lines for the precursors were maintained at 240° C.

As shown by FIG. 21, the deposition rate increases an average of 1.3 Å/min for each 1° C. increase in the heater temperature, showing that there is a strong sensitivity to temperature. A deposition rate of over 200 Å/minute indicates high vaporizer efficiency.

A high deposition rate of 150 Å/minute process can provide a high quality film having good uniformity within the wafer and from wafer to wafer. A heater temperature of 550° C. provided a wafer temperature of 470° C. and a deposition rate of 160 Å/minute. Satisfactory electrical properties have been obtained with a deposition rate as high as 169 Å/minute.

Figure 22:
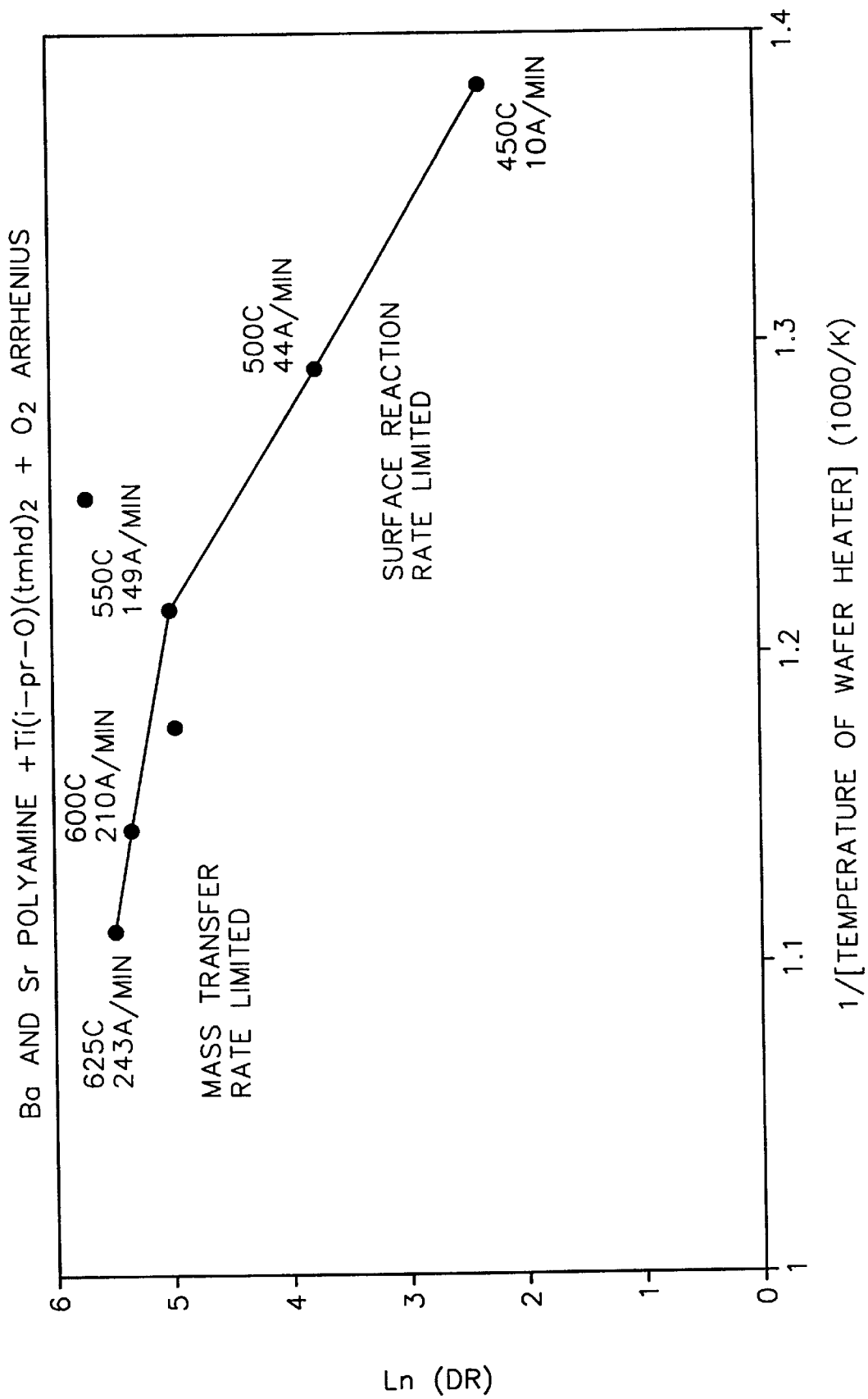

FIG. 22 is a graph of the log of the deposition rate shown in FIG. 21 versus 1 divided by the temperature of the wafer heater in 1000° K. As shown in FIG. 22, there are two distinct regimes with respect to the deposition rate. Mass transport of the precursors limits the deposition process were the log of the deposition rate is around 5 or greater. The deposition process is surface reaction limited where the log of the deposition rate is about 4 or smaller. The transition between these two regimes takes place at about 550° C., or about a 470° C. wafer temperature. A 500–550° C. regime provides good uniformity for step coverage optimization. Results were obtained by simply varying the temperature and observing the deposition rate. The significance is that the PMDETA precursors are permitting high decomposition rates and a well behaved reaction mechanism with a simple single transition in rate controlling reaction at a 470° C. wafer temperature.

Figure 23:
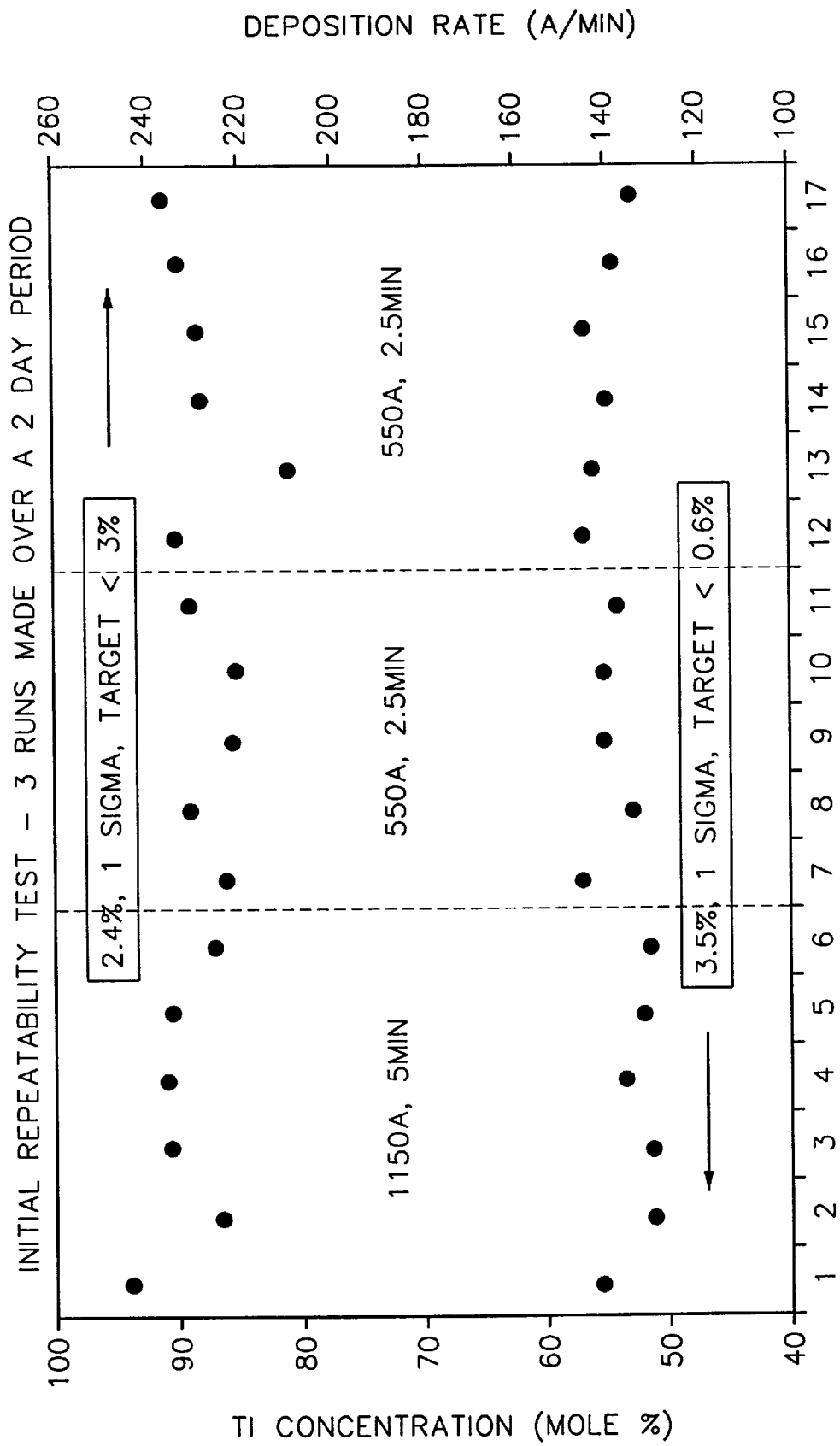

FIG. 23 demonstrates the high quality films produced by this invention using the process conditions described for FIG. 21. Three deposition runs were made over a two day period to deposit films having thicknesses of 1150 Å, 550 Å, and 550 Å. The uniformity of the wafers is shown by a graph of measured titanium concentration (mole %) versus wafer number as well as measured deposition rate (Å/min) versus wafer number. This graph shows that wafer-to-wafer deposition rates are uniform and meet the desired target rate. This graph also illustrates a rapid change in Ti concentration for the first several wafers in each run which presents an opportunity for improvement of the process. This graph further shows that the composition is not very sensitive to deposition time as had been expected. FIG. 23 shows reasonably tight process control which can be further improved through the use of 3-part barium, strontium and titanium mixtures and by running the vaporizer in continuous flow mode.

FIG. 24 is a table of a Ti sensitivity test with a wafer heater temperature of plus or minus 0.5° C. during deposition. This figure shows the mole % for Ti, Ba, and Sr for two separate wafers. Si Prime means non-previously used silicon. Si Recl means reclaimed silicon from other processes. Pt /ox 1 is an oxidized silicon substrate with platinum sputtered thereon using physical vapor deposition techniques. Pt /ox 2 is an oxidized platinum substrate further characterized as electron beam platinum. The matrix results show that plus or minus 0.5° C. during deposition yields the best repeatability in 5 out of six cases. In addition, the matrix results show that the substrate is coated with about 8–10 mole % more Ti on Pt versus Si, and about 2 mole % Ti for 20% Ti(I-pr-O) demonstrating substrate sensitivity.

Figure 25:
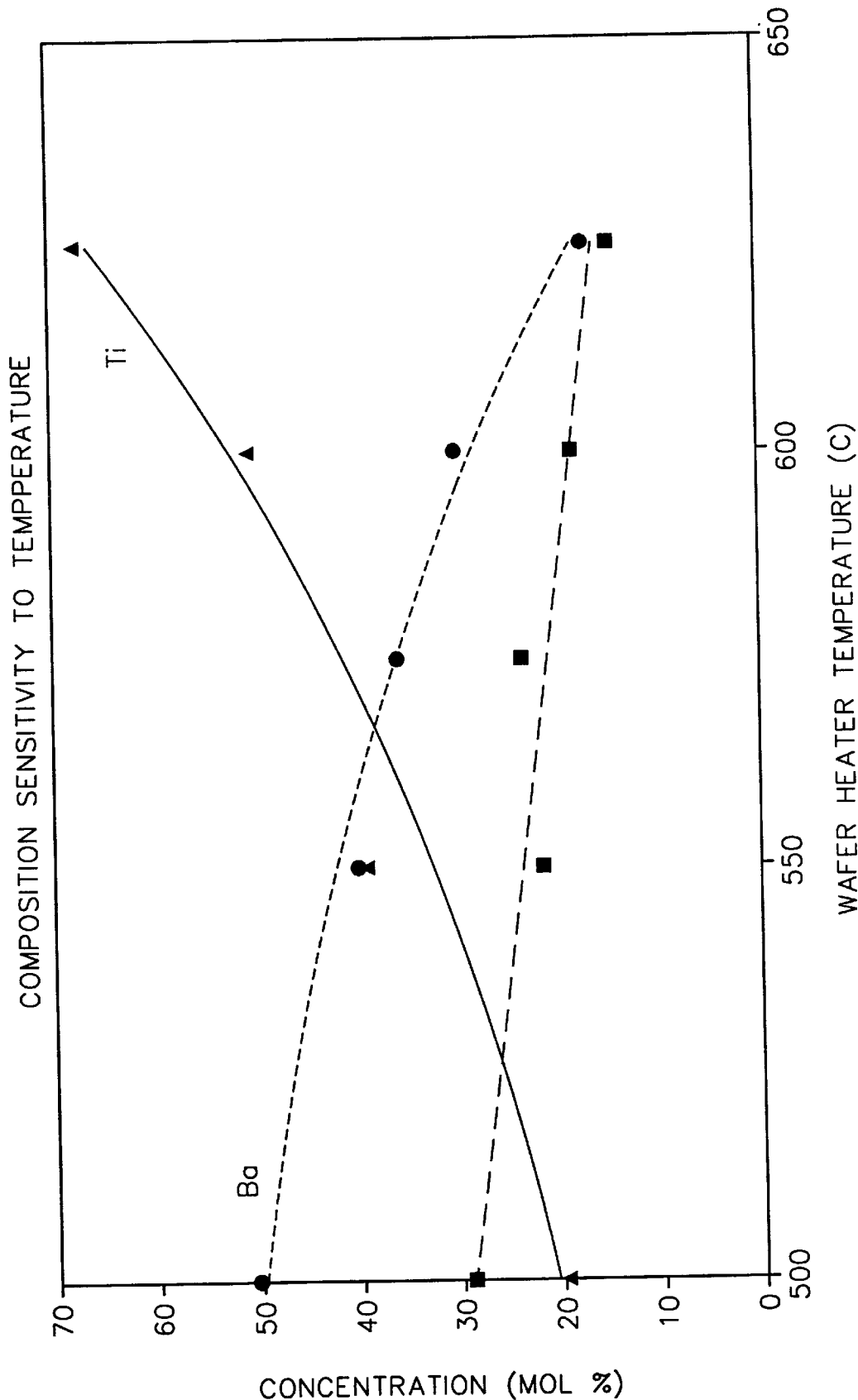

FIG. 25 is a graph of the composition sensitivity of Ti, Ba and Sr to temperature in the CVD BST process described for FIG. 21, where concentration (mole %) of Ti, Ba and Sr are each plotted versus wafer heater temperature. At about 600° C., the Ti concentration of the deposited film increases 1 mole % for each increase in heater temperature of 2° C. At about 600° C., the Ba concentration of the deposited film decreases 1 mole % for each increase in heater temperature of 2.5° C. At about 600° C., the Sr concentration of the deposited film decreases 1 mole % for each increase in heater temperature of 10° C. demonstrating strong temperature dependence. This temperature dependence is substantially reduced at a 680° C. heater temperature.

In the preferred embodiment of the present invention, it is critical to maintain the heater in the 600–750° C. range to optimize electrical properties and for optimal step coverage. It has been found that certain chemicals used in a certain temperature range produce good results. Specifically, polyamine based Ba and Sr precursors and Ti (I-pr-o) are the precursors that are believed to work the best in the present invention. A wafer control of plus or minus 0.50° C. is preferred for the above-mentioned precursors.

EXAMPLE 1

A preferred process according to the present invention deposits a BST film on a 200 mm wafer mounted on a heated substrate holder spaced 550 mils from a gas distribution showerhead or face plate. The deposition occurs at 1.7 Torr with a wafer temperature of 600° C. and the following flow rates. The first precursor was 33 mg/min to 200 mg/min of a mixture of Ba PMDET (tmhd)$_2$ and Sr PMDET (tmhd)$_2$ in butyl acetate having a molar ratio of Ba:Sr of 2:1. The second precursor was 17 mg/min to 77 mg/min of Ti (I-pr-o) (tmhd)$_2$ in butyl acetate which provides a molar ratio of Ba:Sr:Ti of 2:1:4. The substrate was a Pt/SiO$_2$/Si. A deposition rate of 40 to 160 Å/minute is achieved using process gas flow rate of 2900 sccm (that is, a combination of O$_2$ at 500 sccm, N$_2$O at 500 sccm, Ar$_A$ at 1500 sccm, and Ar$_B$ at approximately 900 sccm). A vaporizer according to the present invention was also used, wherein the vaporizer lines for the precursors were maintained at 240° C.

EXAMPLE 2

Figure 26:
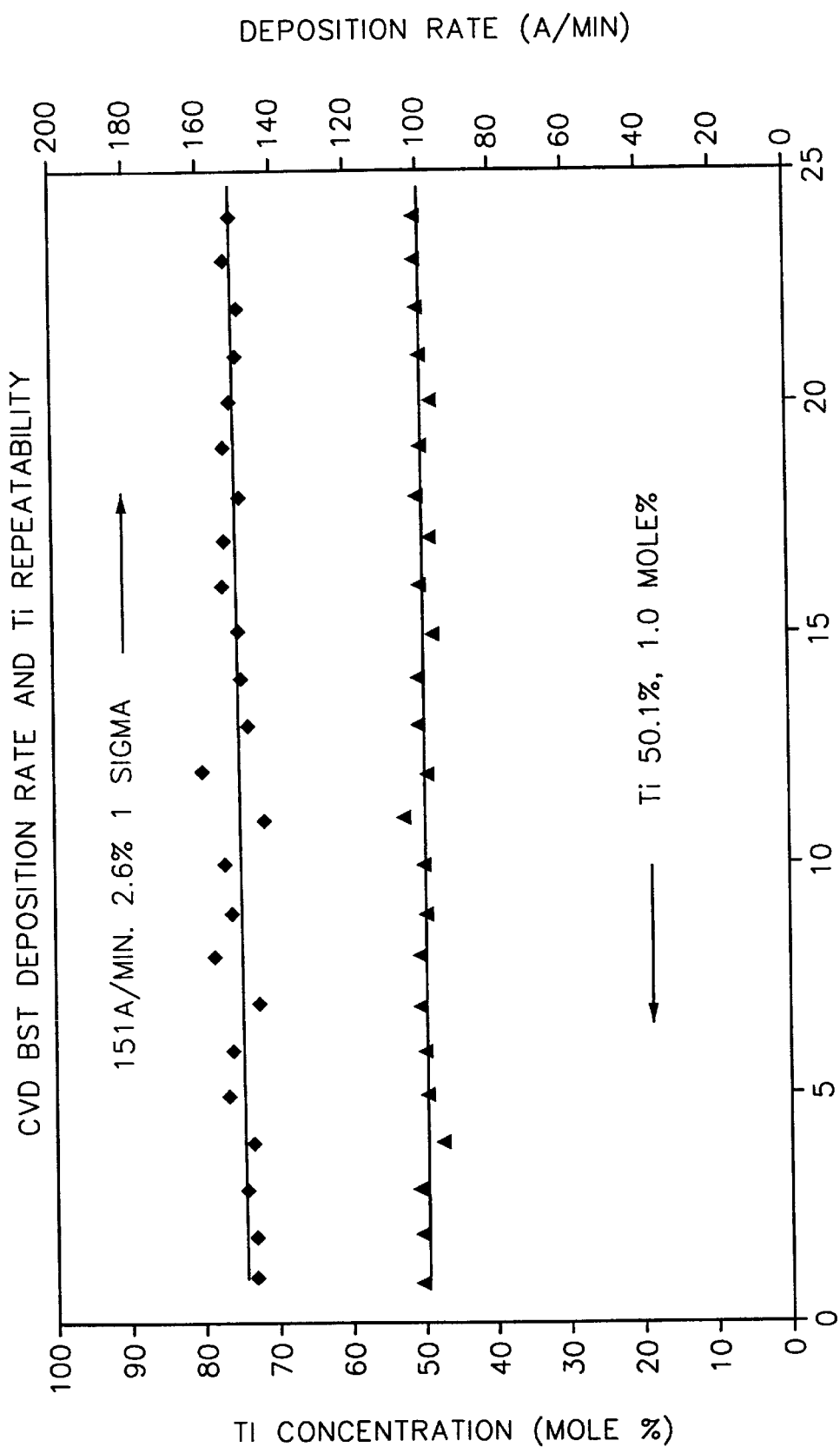
Figure 27:
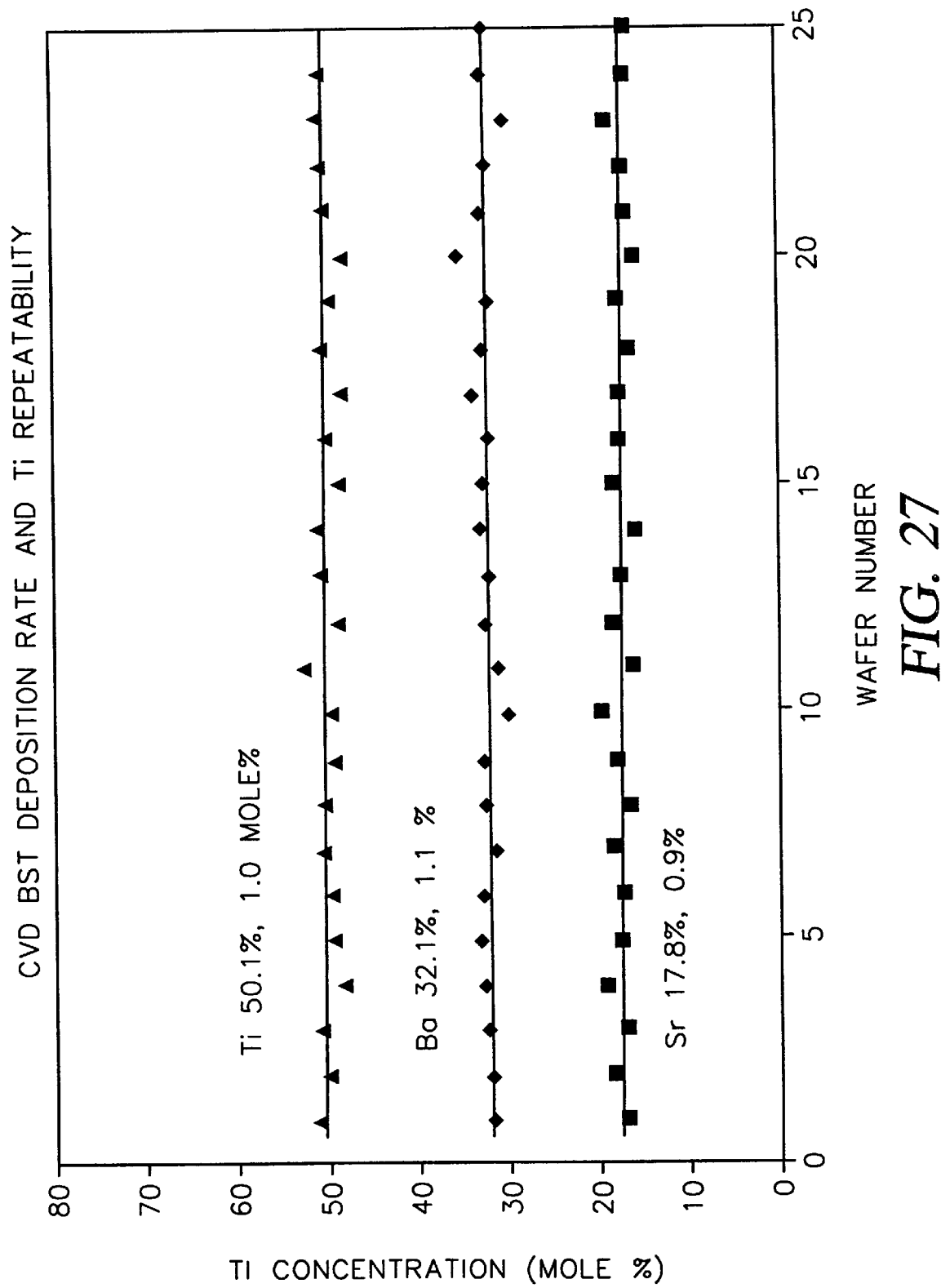

In another example, a process according to the present invention deposits a BST film on a 200 mm wafer mounted on a heated substrate holder spaced 550 mils from a gas distribution showerhead. The deposition occurs at 7 Torr with a heater temperature of about 680° C. and the following flow rates. The first precursor was 33 mg/min to 200 mg/min of a mixture of Ba PMDET (tmhd)$_2$ and Sr PMDET (tmhd)$_2$ in butyl acetate having a molar ratio of Ba:Sr of 2:1. The second precursor was 17 mg/min to 77 mg/min of Ti (I-pr-o) (tmhd)$_2$ in butyl acetate which provides a molar ratio of Ba:Sr:Ti of 2:1:4. The substrate was a Pt/SiO$_2$/Si. A deposition rate of 151 Å/minute was achieved using process gas flow rate of 1300 sccm (that is, a combination of O$_2$ at 250 sccm, N$_2$O at 250 sccm, Ar$_A$ at 500 sccm, and Ar$_B$ at approximately 300 sccm). A vaporizer according to the present invention was also used, wherein the vaporizer lines for the precursors were maintained at 240° C. As shown in FIGS. 26 and 27, a two mixture process showed repeatable results over a twenty five wafer run.

EXAMPLE 3

In another example, the system was cleaned using acetone as a solvent. The acetone used was not dried. A deposition process according to that described in Example 1 was then performed. A 2x increase in the deposition rate was observed indicating that residual acetone solvent stabilized the precursors on delivery to the substrate and consequently resulted in the higher deposition rate. It is believed that the acetone stabilizes the precursors through hydrogen bonding so that more precursor is delivered to the substrate surface for reaction.

EXAMPLE 4

It is believed that use of a solvent such as acetone during the deposition process will stabilize the precursors and result in a higher deposition rate.

While the foregoing is directed to a preferred embodiment of the invention, other and further embodiments of the invention may be devised without departing from the basic scope thereof, and the scope thereof is determined by the claims which follow.

What is claimed is:

1. An apparatus for filtering a fluid in a semiconductor processing system, comprising:
   a) a housing; and
   b) a filtering member disposable in the housing, comprising:
      i) a base portion; and
      ii) a filtering portion having an inlet and an outlet and a plurality of temperature controlled fluid passages formed between the inlet and the outlet.

2. The apparatus of claim 1, wherein the fluid passages are integrally formed within the filtering portion.

3. The apparatus of claim 1, further comprising one or more cooling conduits disposed in the filtering portion and axially aligned with the fluid passages.

4. The apparatus of claim 3, wherein the one or more passages are arranged and sized to provide initial conductance at least equal to the conductance of the gas prior to entering the filtering portion.

5. The apparatus of claim 1, wherein the filter inlet, the filter outlet and the fluid passages are substantially aligned along a longitudinal axis of the filtering portion.

6. The apparatus of claim 5, wherein a gas flow path through the filter inlet, the filter outlet and the fluid passageways are substantially aligned along a longitudinal axis of the filtering portion.

7. The apparatus of claim 1, further comprising a plurality of cooling conduits formed continuously between the filter inlet and the filter outlet.

8. The apparatus of claim 7, wherein the one or more cooling conduits have a cooling inlet and a cooling outlet axially aligned with the cooling inlet.

9. An apparatus for filtering a fluid in a semiconductor processing system, comprising:
   a) a housing;
   b) a filtering portion disposable in the housing, comprising one or more temperature controlled fluid passages formed therein; and
   c) one or more cooling conduits in substantially continuous conductive contact with the fluid passages, the cooling conduits having a cooling inlet and a cooling outlet disposed through the filtering portion.

10. The apparatus of claim 9, wherein the cooling inlet is axially aligned with the cooling outlet.

11. The apparatus of claim 9, further comprising a base portion coupled to the filtering portion and disposable in the housing, wherein the base portion is separated from the filtering portion and defines a exhaust passage therebetween for fluid flowing through the fluid passages.

12. The apparatus of claim 9, wherein the one or more fluid passages are arranged and sized to provide initial conductance substantially equal to the conductance of the gas prior to entering the filtering portion.

13. An apparatus for filtering a fluid in a semiconductor processing system, comprising:
   a) a housing; and
   b) a filtering member disposable in the housing and having a filtering portion, comprising:
      i) a filter inlet at one end of the filtering portion and a filter outlet at a second end of the filtering portion; and ii) a plurality of temperature controlled fluid passages formed between the filter inlet and the filter outlet.

14. The apparatus of claim 13, wherein the passages have a length longer than a width across the passages.

15. The apparatus of claim 13, wherein the fluid passages are integrally formed within the filtering portion.

16. The apparatus of claim 13, further comprising one or more cooling conduits disposed in the filtering portion and aligned axially with the fluid passages.

17. The apparatus of claim 16, wherein the one or more passages are arranged and sized to provide initial conductance at least equal to the conductance of the gas prior to entering the filtering portion.

18. The apparatus of claim 13, wherein the filter inlet, the filter outlet and the fluid passages are substantially aligned along a longitudinal axis of the filtering portion.

19. The apparatus of claim 18, wherein a gas flow path through the filter inlet, the filter outlet and the fluid passageways are substantially aligned along a longitudinal axis of the filtering portion.

20. The apparatus of claim 13, wherein the one or more cooling conduits have a cooling inlet and a cooling outlet and wherein the cooling inlet is axially aligned with the cooling outlet.

21. An apparatus for filtering a fluid in a semiconductor processing system, comprising:

a) a housing; and b) a filtering body disposable in the housing and having a one or more temperature controlled fluid passages and one or more cooling conduits formed therein.

22. The apparatus of claim 21, wherein the fluid passages and the cooling conduits are formed substantially continuously through the filtering body.

23. The apparatus of claim 22, wherein the cooling conduits are formed adjacent the fluid passages.

* * * * *

UNITED STATES PATENT AND TRADEMARK OFFICE
CERTIFICATE OF CORRECTION

PATENT NO. : 6,066,209
DATED : May 23, 2000
INVENTOR(S) : Sajoto et al.

It is certified that error appears in the above-identified patent and that said Letters Patent is hereby corrected as shown below:

Page 1,
Other publications section, after "Somekh et al. filed Sep. 11,", please replace "1998" with -- 1997 --.

Column 5,
Line 47, after "application", please insert -- 08/892,612 --.

Column 6,
Line 12 to line 25, after "46.", please delete "One or more oxidizer gas passages 52, similar to passage 38, are also formed in the chamber body 12 adjacent the passage 38 for receiving an oxidizer gas delivery feedthrough which can be heated if desired to deliver one or more oxidizer gases through the chamber wall to the mixing gas manifold 46. A gas passage 54 is formed in the mixing gas manifold 46 to deliver the oxidizer gas to a gas outlet 56, which provides a mixing point located in the gas manifold adjacent the entry port into the gas distribution plate 26. A restrictive gas passage 37 connects the end of the oxidizer gas passage 54 to the end of the vaporized gas passage 48 to provide high velocity delivery as well as mixing of the gas mixture upstream from the gas distribution plate 26.".

Column 6,
Line 55, before "50 is", please insert -- seal --.

Column 10,
Line 19, before "Fig. 8", please insert -- One or more oxidizer gas passages 52, similar to passage 38, are also formed in the chamber body 12 adjacent the passage 38 for receiving an oxidizer gas delivery feedthrough which can be heated if desired to deliver one or more oxidizer gases through the chamber wall to the mixing gas manifold

UNITED STATES PATENT AND TRADEMARK OFFICE
CERTIFICATE OF CORRECTION

Page 2 of 2

PATENT NO. : 6,066,209
DATED : May 23, 2000
INVENTOR(S) : Sajoto et al.

It is certified that error appears in the above-identified patent and that said Letters Patent is hereby corrected as shown below:

46. A gas passage 54 is formed in the mixing gas manifold 46 to deliver the oxidizer gas to a gas outlet 56, which provides a mixing point located in the gas manifold adjacent the entry port into the gas distribution plate 26. A restrictive gas passage 37 connects the end of the oxidizer gas passage 54 to the end of the vaporized gas passage 48 to provide high velocity delivery as well as mixing of the gas mixture upstream from the gas distribution plate 26."--

Column 10,
Line 35, after "vaporized", please insert -- first --.

Column 12,
Line 61, please replace "isovalve 128" with -- second valve 158 --.

Signed and Sealed this

Second Day of October, 2001

Attest:

*Nicholas P. Godici*

NICHOLAS P. GODICI
Attesting Officer  *Acting Director of the United States Patent and Trademark Office*